United States Patent
Noh et al.

(10) Patent No.: US 11,411,673 B2
(45) Date of Patent: Aug. 9, 2022

(54) METHOD AND APPARATUS FOR TRANSMITTING INFORMATION, AND METHOD AND APPARATUS FOR RECEIVING INFORMATION

(71) Applicant: LG Electronics Inc., Seoul (KR)

(72) Inventors: Kwangseok Noh, Seoul (KR); Bonghoe Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 32 days.

(21) Appl. No.: 16/958,820

(22) PCT Filed: Jan. 11, 2019

(86) PCT No.: PCT/KR2019/000472
§ 371 (c)(1),
(2) Date: Jun. 29, 2020

(87) PCT Pub. No.: WO2019/139412
PCT Pub. Date: Jul. 18, 2019

(65) Prior Publication Data
US 2021/0075538 A1  Mar. 11, 2021

Related U.S. Application Data

(60) Provisional application No. 62/616,438, filed on Jan. 12, 2018.

(51) Int. Cl.
*H04L 1/00* (2006.01)
(52) U.S. Cl.
CPC .......... *H04L 1/0009* (2013.01); *H04L 1/0023* (2013.01); *H04L 1/0033* (2013.01)

(58) Field of Classification Search
CPC ... H04L 1/0009; H04L 1/0023; H04L 1/0033; H04L 1/0068; H04L 1/0061;
(Continued)

(56) References Cited

U.S. PATENT DOCUMENTS

2017/0288703 A1* 10/2017 Shen ............... H04L 1/0071
2018/0278272 A1*  9/2018 Li .................... H03M 13/13
(Continued)

FOREIGN PATENT DOCUMENTS

KR  1020150122757  11/2015
KR  1020160130471  11/2016
(Continued)

OTHER PUBLICATIONS

Demijan Klinc, "On applications of puncturing in error-correction coding," Georgia Institute of Technology, http://hdl.handle.net/1853/39610, dated Apr. 5, 2011, 138 pages.
(Continued)

*Primary Examiner* — Ajit Patel
*Assistant Examiner* — Wilfred Thomas
(74) *Attorney, Agent, or Firm* — Fish & Richardson P.C.

(57) ABSTRACT

A transmission method or a transmission apparatus maps input information of K+n bits to a polar code, encodes the input information on the basis of the polar code, and transmits the encoded input information. The input information includes n parity check bits. n1 bits of the n parity check bits are mapped to least reliable bit positions of K+n bit positions of the polar code, and n−n1 parity check bits (where n−n1>0) are mapped to n−n1 bit positions having a minimum row weight among K+n−n1 bit positions excluding the n1 least reliable bit positions among the K+n bit positions.

12 Claims, 13 Drawing Sheets (a)

(b)

(58) Field of Classification Search
CPC ....... H04L 1/0057; H04L 1/0071; H04L 1/00; H03M 13/00; H03M 13/13
See application file for complete search history.

(56) References Cited

U.S. PATENT DOCUMENTS

| | | |
|---|---|---|
| 2019/0215099 A1* | 7/2019 | Dai ........................ H04L 1/0068 |
| 2020/0099469 A1* | 3/2020 | Jiang ..................... H04L 1/0041 |
| 2021/0135783 A1* | 5/2021 | Yang ................. H03M 13/6356 |

FOREIGN PATENT DOCUMENTS

| | | |
|---|---|---|
| KR | 1020170097190 | 8/2017 |
| KR | 1020170104467 | 9/2017 |

OTHER PUBLICATIONS

PCT International Search Report and Written Opinion in International Application No. PCT/KR2019/000472, dated Apr. 17, 2019, 18 pages (with English translation).

* cited by examiner

☐ : systematic bit   ▦ : RV point
▨ : Parity 0   ▧ : Parity 1

(a)   (b)

(a)

(b)

(a)

(b)

(a)

(b)

METHOD AND APPARATUS FOR TRANSMITTING INFORMATION, AND METHOD AND APPARATUS FOR RECEIVING INFORMATION

CROSS-REFERENCE TO RELATED APPLICATIONS

This application is a National Stage application under 35 U.S.C. § 371 of International Application No. PCT/KR2019/000472, filed on Jan. 11, 2019, which claims the benefit of U.S. Provisional Application No. 62/616,438, filed on Jan. 12, 2018. The disclosures of the prior applications are incorporated by reference in their entirety.

TECHNICAL FIELD

The present disclosure relates to a wireless communication system and, more particularly, to a method and apparatus for transmitting/receiving information.

BACKGROUND ART

With appearance and spread of machine-to-machine (M2M) communication, machine type communication (MTC) and a variety of devices such as smartphones and tablet Personal Computers (PCs) and technology demanding a large amount of data transmission, data throughput needed in a cellular network has rapidly increased. To satisfy such rapidly increasing data throughput, carrier aggregation technology, cognitive radio technology, etc. for efficiently employing more frequency bands and multiple input multiple output (MIMO) technology, multi-base station (BS) cooperation technology, etc. for raising data capacity transmitted on limited frequency resources have been developed.

As more communication devices have demanded higher communication capacity, there has been necessity of enhanced mobile broadband (eMBB) relative to legacy radio access technology (RAT). In addition, massive machine type communication (mMTC) for providing various services anytime and anywhere by connecting a plurality of devices and objects to each other is one main issue to be considered in future-generation communication.

Further, a communication system to be designed in consideration of services/UEs sensitive to reliability and latency is under discussion. The introduction of future-generation RAT has been discussed by taking into consideration eMBB communication, mMTC, ultra-reliable and low-latency communication (URLLC), and the like.

DISCLOSURE

Technical Problem

Due to introduction of new radio communication technology, the number of user equipments (UEs) to which a BS should provide a service in a prescribed resource region increases and the amount of data and control information that the BS should transmit to the UEs increases. Since the amount of resources available to the BS for communication with the UE(s) is limited, a new method in which the BS efficiently receives/transmits uplink/downlink data and/or uplink/downlink control information using the limited radio resources is needed. In other words, as the density of nodes and/or the density of UEs increases, a method of efficiently using high-density nodes or high-density UEs for communication is needed.

With development of technologies, overcoming delay or latency has become an important challenge. Applications whose performance critically depends on delay/latency are increasing. Accordingly, a method to reduce delay/latency compared to the legacy system is demanded.

In a new communication system, use of Polar codes is considered to improve channel coding performance. The size of Polar codes is generally much greater than that of other codes used for channel coding. Accordingly, when Polar codes are used for channel coding, a method capable of reducing hardware complexity is needed.

The technical objects that can be achieved through the present disclosure are not limited to what has been particularly described hereinabove and other technical objects not described herein will be more clearly understood by persons skilled in the art from the following detailed description.

Technical Solution

According to an aspect of the present disclosure, provided herein a method of transmitting information by a transmitting device in a wireless communication system. The method includes: mapping input information of K+n bits to a Polar code; encoding the input information based on the Polar code; and transmitting the encoded input information. The input information includes n parity check bits. n1 parity check bits among the n parity check bits are mapped to least reliable bit positions among K+n bit positions of the Polar code and n−n1 parity check bits (where n−n1>0) are mapped to n−n1 bit positions with a minimum row weight among K+n−n1 bit positions except for the n1 least reliable bit positions among the K+n bit positions.

According to another aspect of the present disclosure, provided herein is a method of receiving information by a receiving device in a wireless communication system. The method includes: receiving encoded information; and decoding the encoded information based on a Polar code. The encoded information is decoded based on a mapping relationship between input information of K+n bits and bit positions of the Polar code. The input information includes n parity check bits. In the mapping relationship: n1 parity check bits among the n parity check bits are mapped to least reliable bit positions among K+n bit positions of the Polar code, and n−n1 parity check bits (where n−n1>0) are mapped to n−n1 bit positions with a minimum row weight among K+n−n1 bit positions except for the n1 least reliable bit positions among the K+n bit positions.

According to another aspect of the present disclosure, provided herein is a transmitting device for transmitting information in a wireless communication system. The device may include: a transceiver, and a processor operably connected to the transceiver. The processor is configured to: map input information of K+n bits to a Polar code; encode the input information based on the Polar code; and control the transceiver to transmit the encoded input information. The input information includes n parity check bits. The processor may be configured to map n1 parity check bits among the n parity check bits to least reliable bit positions among K+n bit positions of the Polar code and map n−n1 parity check bits (where n−n1>0) to n−n1 bit positions with a minimum row weight among K+n−n1 bit positions except for the n1 least reliable bit positions among the K+n bit positions.

According to another aspect of the present disclosure, provided herein is a receiving device for receiving information in a wireless communication system. The device includes: a transceiver, and a processor operably connected to the transceiver. The processor is configured to: control the transceiver to receive encoded information; and decode the encoded information based on a Polar code. The processor is configured to decode the encoded information based on a mapping relationship between input information of K+n bits and bit positions of the Polar code. The input information includes n parity check bits. In the mapping relationship: n1 parity check bits among the n parity check bits are mapped to least reliable bit positions among K+n bit positions of the Polar code, and n−n1 parity check bits (where n−n1>0) are mapped to n−n1 bit positions with a minimum row weight among K+n−n1 bit positions except for the n1 least reliable bit positions among the K+n bit positions.

In each aspect of the present disclosure, the n−n1 parity check bits may be mapped to n−n1 most reliable bit positions among bit positions with an equal minimum row weight, when there is more than n−n1 bit positions with the equal minimum row weight.

In each aspect of the present disclosure, the K+n bit positions among a total of N bit positions of the Polar code may be determined based on a predefined Polar sequence.

In each aspect of the present disclosure, the predefined Polar sequence may include a sequence ordering bit indices 0 to N-1 corresponding one by one to bit positions 0 to N-1 of the Polar code in ascending order of reliability.

The above technical solutions are merely some parts of the examples of the present disclosure and various examples into which the technical features of the present disclosure are incorporated can be derived and understood by persons skilled in the art from the following detailed description of the present disclosure.

Advantageous Effects

According to example(s) of the present disclosure, uplink/downlink signals can be efficiently transmitted/received. Therefore, overall throughput of a radio communication system can be improved.

According to example(s) of the present disclosure, delay/latency occurring during communication between a user equipment and a base station may be reduced.

According to example(s) of the present disclosure, decoding speed can be improved when Polar codes are used for channel coding.

According to example(s) of the present disclosure, a block error rate (BLER) can be improved by allocating a specific bit to a specific bit position of Polar codes.

It will be appreciated by persons skilled in the art that that the effects that can be achieved through the present disclosure are not limited to what has been particularly described hereinabove and other advantages of the present disclosure will be more clearly understood from the following detailed description.

BRIEF DESCRIPTION OF THE DRAWINGS

The accompanying drawings, which are included to provide a further understanding of the disclosure, illustrate examples of the disclosure and together with the description serve to explain the principle of the disclosure.

MODE FOR CARRYING OUT THE INVENTION

Figure 1:
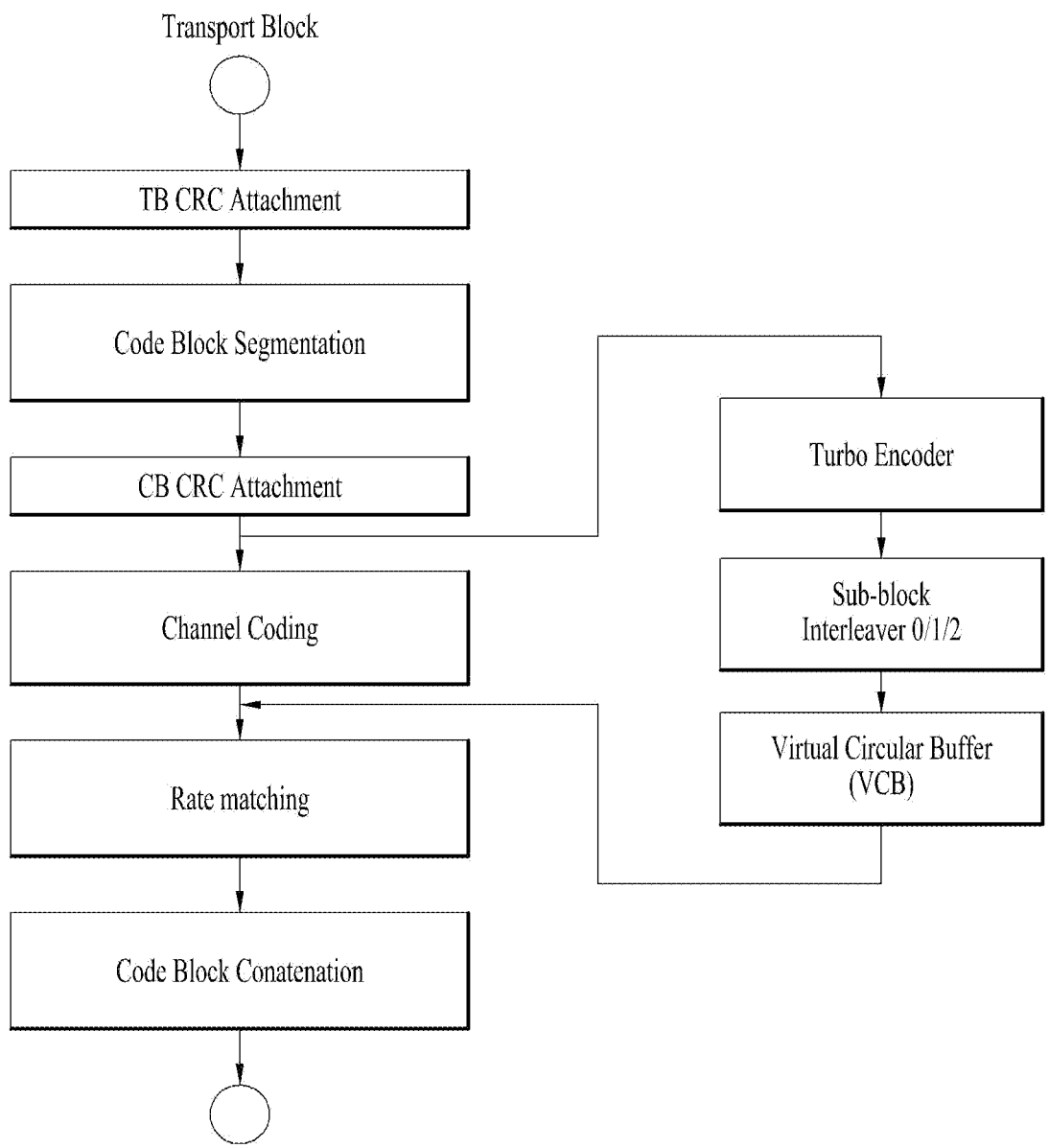
FIG. 1 illustrates a transport block processing procedure in an LTE/LTE-A system.

Reference will now be made in detail to the exemplary examples of the present disclosure, examples of which are illustrated in the accompanying drawings. The detailed description, which will be given below with reference to the accompanying drawings, is intended to explain exemplary examples of the present disclosure, rather than to show the only examples that can be implemented according to the disclosure. The following detailed description includes specific details in order to provide a thorough understanding of the present disclosure. However, it will be apparent to those skilled in the art that the present disclosure may be practiced without such specific details.

In some instances, known structures and devices are omitted or are shown in block diagram form, focusing on important features of the structures and devices, so as not to obscure the concept of the present disclosure. The same reference numbers will be used throughout this specification to refer to the same or like parts.

The following techniques, apparatuses, and systems may be applied to a variety of wireless multiple access systems. Examples of the multiple access systems include a code division multiple access (CDMA) system, a frequency division multiple access (FDMA) system, a time division multiple access (TDMA) system, an orthogonal frequency division multiple access (OFDMA) system, a single carrier frequency division multiple access (SC-FDMA) system, and a multicarrier frequency division multiple access (MC-FDMA) system. CDMA may be embodied through radio technology such as universal terrestrial radio access (UTRA) or CDMA2000. TDMA may be embodied through radio technology such as global system for mobile communications (GSM), general packet radio service (GPRS), or enhanced data rates for GSM evolution (EDGE). OFDMA may be embodied through radio technology such as institute of electrical and electronics engineers (IEEE) 802.11 (Wi-Fi), IEEE 802.16 (WiMAX), IEEE 802.20, or evolved UTRA (E-UTRA). UTRA is a part of a universal mobile telecommunications system (UMTS). 3rd generation partnership project (3GPP) long term evolution (LTE) is a part of evolved UMTS (E-UMTS) using E-UTRA. 3GPP LTE employs OFDMA in DL and SC-FDMA in UL. LTE-advanced (LTE-A) is an evolved version of 3GPP LTE. For convenience of description, it is assumed that the present disclosure is applied to 3GPP based communication system, e.g. LTE/LTE-A, NR. However, the technical features of the present disclosure are not limited thereto. For example, although the following detailed description is given based on a mobile communication system corresponding to a 3GPP LTE/LTE-A/NR system, aspects of the present disclosure that are not specific to 3GPP LTE/LTE-A/NR are applicable to other mobile communication systems.

In examples of the present disclosure described below, the expression that a device "assumes" may mean that a subject which transmits a channel transmits the channel in accordance with the corresponding "assumption". This may also mean that a subject which receives the channel receives or decodes the channel in a form conforming to the "assumption", on the assumption that the channel has been transmitted according to the "assumption".

In the present disclosure, a user equipment (UE) may be a fixed or mobile device. Examples of the UE include various devices that transmit and receive user data and/or various kinds of control information to and from a base station (BS). The UE may be referred to as a terminal equipment (TE), a mobile station (MS), a mobile terminal (MT), a user terminal (UT), a subscriber station (SS), a wireless device, a personal digital assistant (PDA), a wireless modem, a handheld device, etc. In addition, in the present disclosure, a BS generally refers to a fixed station that performs communication with a UE and/or another BS, and exchanges various kinds of data and control information with the UE and another BS. The BS may be referred to as an advanced base station (ABS), a node-B (NB), an evolved node-B (eNB), a base transceiver system (BTS), an access point (AP), a processing server (PS), etc. Particularly, a BS of a UTRAN is referred to as a Node-B, a BS of an E-UTRAN is referred to as an eNB, and a BS of a new radio access technology network is referred to as an gNB. Herein, for convenience of description, a base station will be referred to as a BS regardless of type or version of communication technology.

In the present disclosure, a node refers to a fixed point capable of transmitting/receiving a radio signal through communication with a UE. Various types of BSs may be used as nodes irrespective of the terms thereof. For example, a BS, a node B (NB), an e-node B (eNB), a pico-cell eNB (PeNB), a home eNB (HeNB), a relay, a repeater, etc. may be a node. In addition, the node may not be a BS. For example, the node may be a radio remote head (RRH) or a radio remote unit (RRU). The RRH or RRU generally has a lower power level than a power level of a BS. Since the RRH or RRU (hereinafter, RRH/RRU) is generally connected to the BS through a dedicated line such as an optical cable, cooperative communication between RRH/RRU and the BS can be smoothly performed in comparison with cooperative communication between BSs connected by a radio line. At least one antenna is installed per node. The antenna may mean a physical antenna or mean an antenna port or a virtual antenna.

In the present disclosure, a cell refers to a prescribed geographical area to which one or more nodes provide a communication service. Accordingly, in the present disclosure, communicating with a specific cell may mean communicating with a BS or a node which provides a communication service to the specific cell. In addition, a DL/UL signal of a specific cell refers to a DL/UL signal from/to a BS or a node which provides a communication service to the specific cell. A node providing UL/DL communication services to a UE is called a serving node and a cell to which UL/DL communication services are provided by the serving node is especially called a serving cell. Furthermore, channel status/quality of a specific cell refers to channel status/quality of a channel or communication link formed between a BS or node which provides a communication service to the specific cell and a UE. In the 3GPP based communication system, the UE may measure DL channel state received from a specific node using cell-specific reference signal(s) (CRS(s)) transmitted on a CRS resource and/or channel state information reference signal(s) (CSI-RS(s)) transmitted on a CSI-RS resource, allocated by antenna port(s) of the specific node to the specific node.

Meanwhile, a 3GPP based communication system uses the concept of a cell in order to manage radio resources and a cell associated with the radio resources is distinguished from a cell of a geographic region.

A "cell" of a geographic region may be understood as coverage within which a node can provide service using a carrier and a "cell" of a radio resource is associated with bandwidth (BW) which is a frequency range configured by the carrier. Since DL coverage, which is a range within which the node is capable of transmitting a valid signal, and UL coverage, which is a range within which the node is capable of receiving the valid signal from the UE, depends upon a carrier carrying the signal, the coverage of the node may be associated with coverage of the "cell" of a radio resource used by the node. Accordingly, the term "cell" may be used to indicate service coverage of the node sometimes, a radio resource at other times, or a range that a signal using a radio resource can reach with valid strength at other times.

Meanwhile, the 3GPP communication standards use the concept of a cell to manage radio resources. The "cell" associated with the radio resources is defined by combination of downlink resources and uplink resources, that is, combination of DL CC and UL CC. The cell may be configured by downlink resources only, or may be configured by downlink resources and uplink resources. If carrier aggregation is supported, linkage between a carrier frequency of the downlink resources (or DL CC) and a carrier frequency of the uplink resources (or UL CC) may be indicated by system information. For example, combination of the DL resources and the UL resources may be indicated by linkage of system information block type 2 (SIB2). The carrier frequency may be the same as a center frequency of each cell or CC. A cell operating on a primary frequency may be referred to as a primary cell (Pcell) or PCC, and a cell operating on a secondary frequency may be referred to as a secondary cell (Scell) or SCC. The carrier corresponding to the Pcell on downlink will be referred to as a downlink primary CC (DL PCC), and the carrier corresponding to the Pcell on uplink will be referred to as an uplink primary CC (UL PCC). A Scell means a cell that may be configured after completion of radio resource control (RRC) connection establishment and used to provide additional radio resources. The Scell may form a set of serving cells for the UE together with the Pcell in accordance with capabilities of the UE. The carrier corresponding to the Scell on the downlink will be referred to as downlink secondary CC (DL SCC), and the carrier corresponding to the Scell on the uplink will be referred to as uplink secondary CC (UL SCC). Although the UE is in RRC-CONNECTED state, if it is not configured by carrier aggregation or does not support carrier aggregation, a single serving cell configured by the Pcell only exists.

3GPP based communication standards define DL physical channels corresponding to resource elements carrying information derived from a higher layer and DL physical signals corresponding to resource elements which are used by a physical layer but which do not carry information derived from a higher layer. For example, a physical downlink shared channel (PDSCH), a physical broadcast channel (PBCH), a physical multicast channel (PMCH), a physical control format indicator channel (PCFICH), a physical downlink control channel (PDCCH), and a physical hybrid ARQ indicator channel (PHICH) are defined as the DL physical channels, and a reference signal and a synchronization signal are defined as the DL physical signals. A reference signal (RS), also called a pilot, refers to a special waveform of a predefined signal known to both a BS and a UE. For example, a cell-specific RS (CRS), a UE-specific RS (UE-RS), a positioning RS (PRS), and channel state information RS (CSI-RS) may be defined as DL RSs. Meanwhile, the 3GPP based communication standards define UL physical channels corresponding to resource elements carrying information derived from a higher layer and UL physical signals corresponding to resource elements which are used by a physical layer but which do not carry information derived from a higher layer. For example, a physical uplink shared channel (PUSCH), a physical uplink control channel (PUCCH), and a physical random access channel (PRACH) are defined as the UL physical channels, and a demodulation reference signal (DM RS) for a UL control/data signal and a sounding reference signal (SRS) used for UL channel measurement are defined as the UL physical signals.

In the present disclosure, a physical downlink control channel (PDCCH), a physical control format indicator channel (PCFICH), a physical hybrid automatic retransmit request indicator channel (PHICH), and a physical downlink shared channel (PDSCH) refer to a set of time-frequency resources or resource elements (REs) carrying downlink control information (DCI), a set of time-frequency resources or REs carrying a control format indicator (CFI), a set of time-frequency resources or REs carrying downlink acknowledgement (ACK)/negative ACK (NACK), and a set of time-frequency resources or REs carrying downlink data, respectively. In addition, a physical uplink control channel (PUCCH), a physical uplink shared channel (PUSCH) and a physical random access channel (PRACH) refer to a set of time-frequency resources or REs carrying uplink control information (UCI), a set of time-frequency resources or REs carrying uplink data and a set of time-frequency resources or REs carrying random access signals, respectively. In the present disclosure, in particular, a time-frequency resource or RE that is assigned to or belongs to PDCCH/PCFICH/PHICH/PDSCH/PUCCH/PUSCH/PRACH is referred to as PDCCH/PCFICH/PHICH/PDSCH/PUCCH/PUSCH/PRACH RE or PDCCH/PCFICH/PHICH/PDSCH/PUCCH/PUSCH/PRACH time-frequency resource, respectively. Therefore, in the present disclosure, PUCCH/PUSCH/PRACH transmission of a UE is conceptually identical to UCI/uplink data/random access signal transmission on PUSCH/PUCCH/PRACH, respectively. In addition, PDCCH/PCFICH/PHICH/PDSCH transmission of a BS is conceptually identical to downlink data/DCI transmission on PDCCH/PCFICH/PHICH/PDSCH, respectively.

For terms and technologies which are not described in detail in the present disclosure, reference can be made to the standard document of 3GPP LTE/LTE-A, for example, 3GPP TS 36.211, 3GPP TS 36.212, 3GPP TS 36.213, 3GPP TS 36.321, and 3GPP TS 36.331 and the standard document of 3GPP NR, for example, 3GPP TS 38.211, 3GPP TS 38.212, 3GPP TS 38.213, 3GPP TS 38.214, 3GPP TS 38.300 and 3GPP TS 38.331. In addition, as to polar codes and the principle of encoding and decoding using the polar codes, reference may be made to 'E. Arikan, "Channel Polarization: A Method for Constructing Capacity-Achieving Codes for Symmetric Binary-Input Memoryless Channels," in IEEE Transactions on Information Theory, vol. 55, no. 7, pp. 3051-3073, July 2009'.

As more communication devices have demanded higher communication capacity, there has been necessity of enhanced mobile broadband relative to legacy radio access technology (RAT). In addition, massive machine type communication for providing various services irrespective of time and place by connecting a plurality of devices and objects to each other is one main issue to be considered in future-generation communication. Further, a communication system design in which services/UEs sensitive to reliability and latency are considered is under discussion. The introduction of future-generation RAT has been discussed by taking into consideration enhanced mobile broadband communication, massive MTC, ultra-reliable and low-latency communication (URLLC), and the like. In current 3GPP, a study of the future-generation mobile communication system after EPC is being conducted. In the present disclosure, the corresponding technology is referred to as a new RAT (NR) or 5G RAT, for convenience.

An NR communication system demands that much better performance than a legacy fourth generation (4G) system be supported in terms of data rate, capacity, latency, energy consumption, and cost. Accordingly, the NR system needs to make progress in terms of bandwidth, spectrum, energy, signaling efficiency, and cost per bit. NR needs to use efficient waveforms in order to satisfy these requirements.

FIG. 1 illustrates a transport block processing procedure in an LTE/LTE-A system.

In order for a receiving side to correct errors that signals experience in a channel, a transmitting side encodes information using a forward error correction code and then transmits the encoded information. The receiving side demodulates a received signal and decodes the error correction code to thereby recover the information transmitted by the transmitting side. In this decoding procedure, errors in the received signal caused by a channel are corrected.

Data arrives at a coding block in the form of a maximum of two transport blocks every transmission time interval (TTI) in each DL/UL cell. The following coding steps may be applied to each transport block of the DL/UL cell:

cyclic redundancy check (CRC) attachment to a transport block;

code block segmentation and CRC attachment to a code block;

channel coding;

rate matching; and code block concatenation.

Although various types of error correction codes are available, a turbo code has mainly been used in a legacy LTE/LTE-A system. The turbo code is implemented by a recursive systematic convolution encoder and an interleaver. For actual implementation of the turbo code, an interleaver is used to facilitate parallel decoding and quadratic polynomial permutation (QPP) is a kind of interleaving. It is known that a QPP interleaver maintains good performance only for a data block of a specific size. It is known that performance of the turbo code increases with a larger data block size. In an actual communication system, a data block of a predetermined size or larger is divided into a plurality of smaller data blocks and then is encoded, to facilitate actual implementation of coding. The smaller data blocks are called code blocks. While the code blocks are generally of the same size, one of the code blocks may have a different size due to a limited size of the QPP interleaver. Error correction coding is performed on each code block of a predetermined interleaver size and then interleaving is performed to reduce the impact of burst errors that are generated during transmission over a radio channel. The error-corrected and interleaved code block is transmitted by being mapped to an actual radio resource. The amount of radio resources used for actual transmission is designated. Thus, the encoded code blocks are rate-matched to the amount of the radio resources. In general, rate matching is performed through puncturing or repetition. For example, if the amount of radio resources, i.e., the number of transmission bits capable of being transmitted on the radio resources, is M and if a coded bit sequence, i.e., the number of output bits of the encoder, is N, in which M is different from N, then rate matching is performed to match the length of the coded bit sequence to M. If M>N, then all or a part of bits of the coded bit sequence are repeated to match the length of the rate-matched sequence to M. If M<N, then a part of the bits of the coded bit sequence is punctured to match the length of the rate-matched sequence to M and the punctured bits are excluded from transmission.

Namely, in an LTE/LTE-A system, after data to be transmitted is encoded using channel coding having a specific code rate (e.g., ⅓), the code rate of the data to be transmitted is adjusted through a rate-matching procedure consisting of puncturing and repetition. When the turbo code is used as a channel code in the LTE/LTE-A system, a procedure of performing channel coding and rate-matching on each code block in the transport block processing procedure as illustrated in FIG. 1 is illustrated in FIG. 2.

Figure 2:
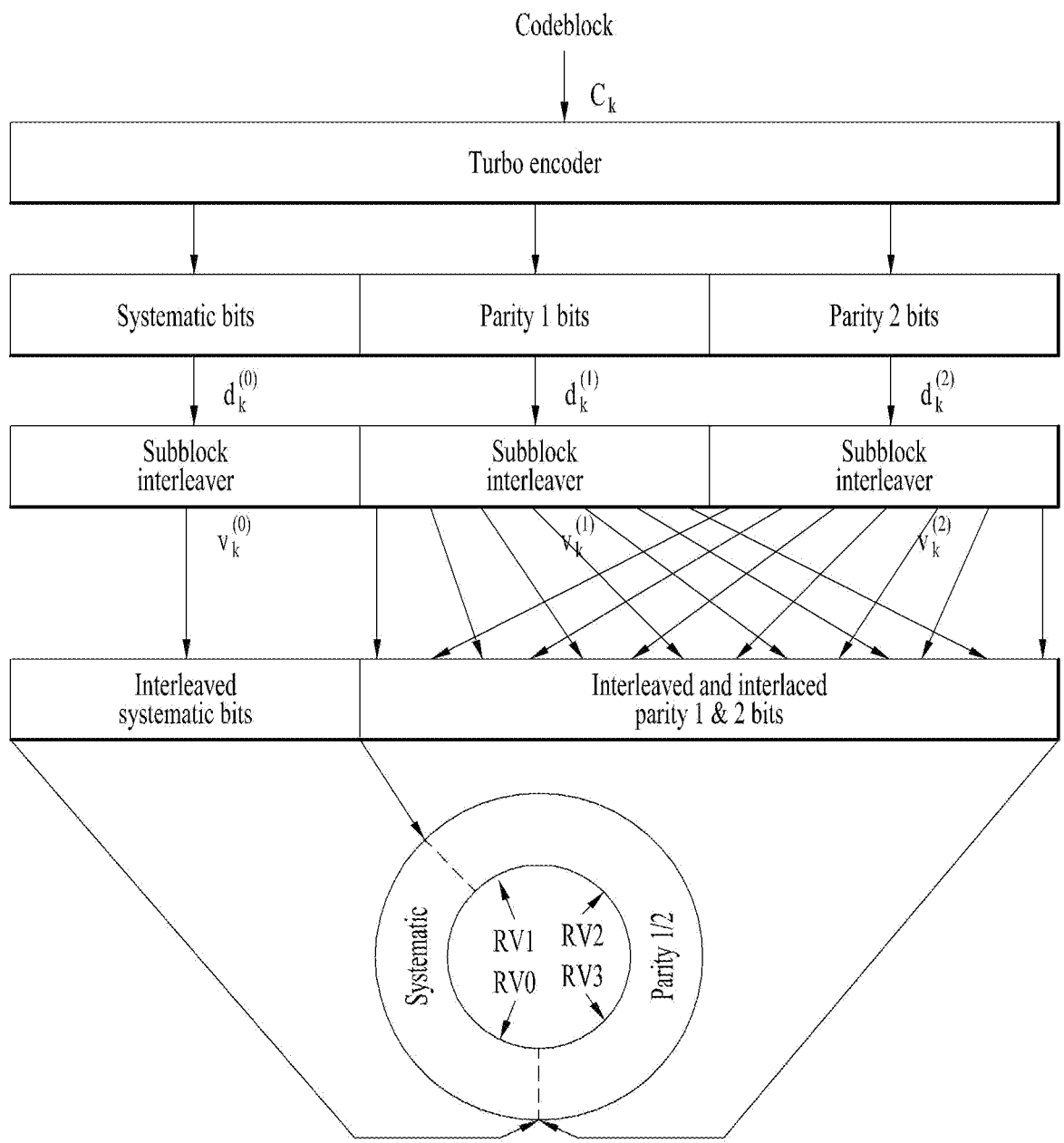
FIG. 2 is a block diagram illustrating rate matching performed by separating an encoded code block into a systematic part and a parity part.

FIG. 2 is a block diagram illustrating rate matching performed by separating an encoded code block into a systematic part and a parity part.

As illustrated in FIG. 2, the mother code rate of an LTE/LTE-A turbo encoder is ⅓. In order to obtain other code rates, if necessary, repetition or puncturing has to be performed, which are performed by a rate matching module. The rate matching module consists of three so-called sub-block interleavers for three output streams of the turbo encoder and a bit selection and pruning part, which is realized by a circular buffer. The sub-block interleaver is based on a classic row-column interleaver with 32 rows and length-32 intra-column permutation. The bits of each of the three streams are written row-by-row into a matrix with 32 columns (number of rows depends on stream size). Dummy bits are padded to the front of each stream to completely fill the matrix. After column permutation, bits are read out from the matrix column-by-column.

Figure 3:
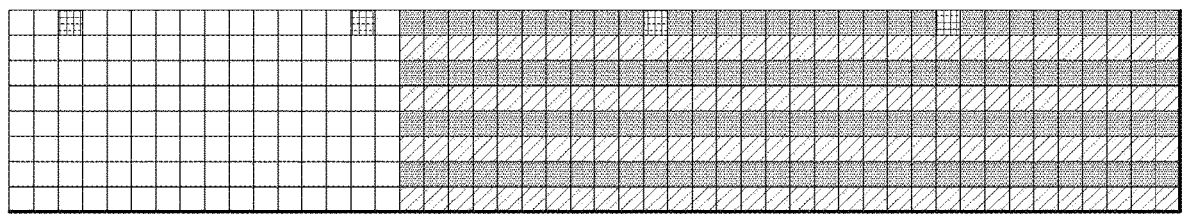
FIG. 3 illustrates an internal structure of a circular buffer.

FIG. 3 illustrates an internal structure of a circular buffer.

The circular buffer is the most important part of the rate matching module, making it possible to perform puncturing and repetition of a mother code. Referring to FIG. 2, the interleaved systematic bits are written into the circular buffer in sequence, with the first bit of the interleaved systematic bit stream at the beginning of the buffer. The interleaved and interlaced parity bit streams are written into the buffer in sequence, with the first bit of the stream next to the last bit of the interleaved systematic bit stream. Coded bits (depending on code rate) are read out serially from a certain starting point specified by redundancy version (RV) points in the circular buffer. If the coded bits reaches the end of the circular buffer and more coded bits are needed for transmission (in the case of a code rate smaller than ⅓), a transmitting device wraps around and continues at the beginning of the circular buffer.

HARQ, which stands for Hybrid ARQ, is an error correction mechanism based on retransmission of packets, which are detected with errors. The transmitted packet arrives at a receiving device after a certain propagation delay. The receiving device produces ACK for the case of error-free transmission or NACK for the case of detection of some errors. ACK/NACK is produced after some processing time and sent back to the transmitting device and arrives at the transmitting device after a propagation delay. In the case of NACK, after a certain processing delay in the transmitting device, a desired packet will be sent again. Bits, which are read out from the circular buffer and sent through retransmission, are different and depend on the position of the RV. There are four RVs (0, 1, 2, and 3), which define the position of a starting point at which the bits are read out from the circular buffer. Referring to FIG. 3, with the progressing number of retransmissions, the RV becomes higher and therefore fewer systematic bits and more parity bits are read out from the circular buffer for retransmission.

NR provides higher speeds and better coverage than current 4G. NR operates in a high frequency band and is required to offer speeds of up to 1 Gb/s for tens of connections or tens of Mb/s for tens of thousands of connections. To meet requirements of such an NR system, introduction of a more evolved coding scheme than a legacy coding scheme is under discussion. Since data communication arises in an incomplete channel environment, channel coding plays an important role in achieving a higher data rate for fast and error-free communication. A selected channel code needs to provide superior block error ratio (BLER) performance for block lengths and code rates of a specific range. Herein, BLER is defined as the ratio of the number of erroneous received blocks to the total number of sent blocks. In NR, low calculation complexity, low latency, low cost, and higher flexibility are demanded for a coding scheme. Furthermore, reduced energy per bit and improved region efficiency are needed to support a higher data rate. Use examples for NR networks are enhanced mobile broadband (eMBB), massive Internet of things (IoT), and ultra-reliable and low latency communication (URLLC). eMBB covers Internet access with high data rates to enable rich media applications, cloud storage and applications, and augmented reality for entertainment. Massive IoT applications include dense sensor networks for smart homes/buildings, remote health monitoring, and logistics tracking. URLLC covers critical applications that demand ultra-high reliability and low latency, such as industrial automation, driverless vehicles, remote surgery, and smart grids.

Although many coding schemes with high capacity performance at large block lengths are available, many of these coding schemes do not consistently exhibit excellent good performance in a wide range of block lengths and code rates. However, turbo codes, low-density parity check (LPDC) codes, and polar codes show promising BLER performance in a wide range of coding rates and code lengths and hence are considered to be used in the NR system. As demand for various cases such as eMBB, massive IoT, and URLLC has increased, a coding scheme providing greater channel coding efficiency than in turbo codes is needed. In addition, increase in a maximum number of subscribers capable of being accommodated by a channel, i.e., increase in capacity, has been required.

Polar codes are codes providing a new framework capable of solving problems of legacy channel codes and were invented by Arikan at Bilkent University (reference: E. Arikan, "Channel Polarization: A Method for Constructing Capacity-Achieving Codes for Symmetric Binary-Input Memoryless Channels," in IEEE Transactions on Information Theory, vol. 55, no. 7, pp. 3051-3073, July 2009). Polar codes are the first capacity-achieving codes with low encoding and decoding complexities, which were proven mathematically. Polar codes outperform the turbo codes in large block lengths while no error flow is present. Hereinafter, channel coding using the polar codes is referred to as polar coding.

Polar codes are known as codes capable of achieving the capacity of a given binary discrete memoryless channel. This can be achieved only when a block size is sufficiently large. That is, polar codes are codes capable of achieving the capacity of a channel if the size N of the codes infinitely increases. Polar codes have low encoding and decoding complexity and may be successfully decoded. Polar codes are a sort of linear block error correction codes. Multiple recursive concatenations are basic building blocks for the polar codes and are bases for code construction. Physical conversion of channels in which physical channels are converted into virtual channels occurs and such conversion is based on a plurality of recursive concatenations. If multiple channels are multiplied and accumulated, most of the channels may become better or worse. The idea underlying polar codes is to use good channels. For example, data is sent through good channels at rate 1 and data is sent through bad channels at rate 0. That is, through channel polarization, channels enter a polarized state from a normal state.

Figure 4:
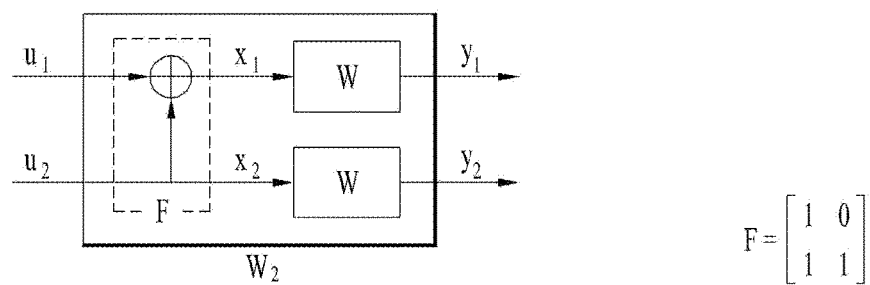
FIG. 4 is a block diagram for a polar code encoder.

FIG. 4 is a block diagram for a polar code encoder.

FIG. 4(a) illustrates a base module of a polar code, particularly, first level channel combining for polar coding. In FIG. 4(a), $W_2$ denotes an entire equivalent channel obtained by combining two binary-input discrete memoryless channels (B-DMCs), Ws. Herein, $u_1$ and $u_2$ are binary-input source bits and $y_1$ and $y_2$ are output coded bits. Channel combining is a procedure of concatenating the B-DMCs in parallel.

FIG. 4(b) illustrates a base matrix F for the base module. The binary-input source bits $u_1$ and $u_2$ input to the base matrix F and the output coded bits $x_1$ and $x_2$ of the base matrix F have the following relationship.

$$[u_1 \ u_2]\begin{bmatrix} 1 & 0 \\ 1 & 1 \end{bmatrix} = [x_1 \ x_2] \quad \text{Equation 1}$$

The channel $W_2$ may achieve symmetric capacity I(W) which is a highest rate. In the B-DMC W, symmetric capacity is an important parameter which is used to measure a rate and is a highest rate at which reliable communication can occur over the channel W. The B-DMC may be defined as follows.

$$I(W) = \sum_{y \in Y} \sum_{x \in X} \frac{1}{2} W(y|x) \log \frac{w(y|x)}{\frac{1}{2}w(y|0) + \frac{1}{2}w(y|1)} \quad \text{Equation 2}$$

It is possible to synthesize or create a second set of N binary input channels out of N independent copies of a given B-DMC W and the channels have the properties $\{W_N^{(i)}: 1 \le i \le N\}$. If N increases, there is a tendency for a part of the channels to have capacity approximating to 1 and for the remaining channels to have capacity approximating to 0. This is called channel polarization. In other words, channel polarization is a process of creating a second set of N channels $\{W_N^{(i)}: 1 \le i \le N\}$ using N independent copies of a given B-DMC W. The effect of channel polarization means that, when N increases, all symmetric capacity terms $\{I(W_N^{(i)})\}$ tend towards 0 or 1 for all except a vanishing fraction of indexes i. In other words, the concept behind channel polarization in the polar codes is transforming N copies (i.e., N transmissions) of a channel having a symmetric capacity of I(W) (e.g., additive white Gaussian noise channel) into extreme channels of capacity close to 1 or 0. Among the N channels, an I(W) fraction will be perfect channels and an 1-I(W) fraction will be completely noise channels. Then, information bits are transmitted only through good channels and bits input to the other channels are frozen to 1 or 0. The amount of channel polarization increases along with a block length. Channel polarization consists of two phases: channel combining phase and channel splitting phase.

Figure 5:
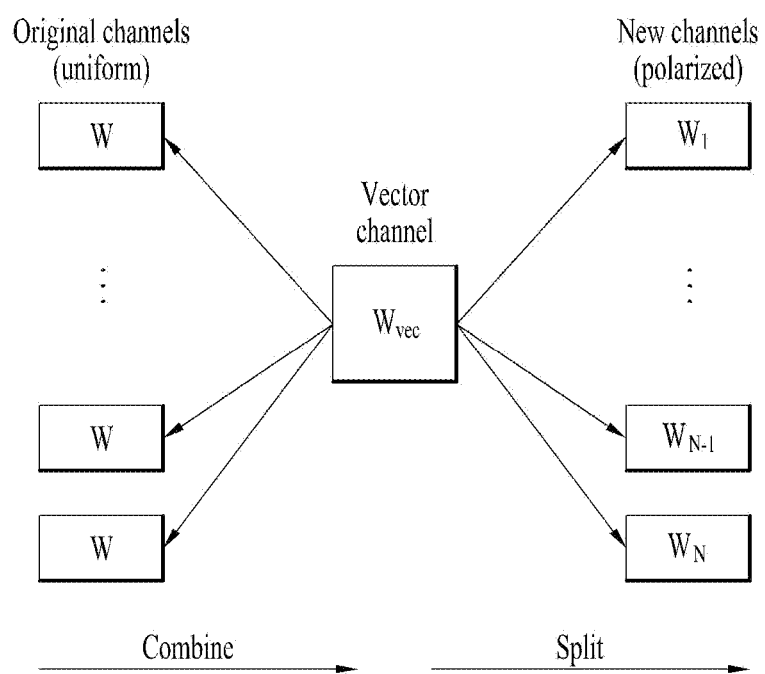
FIG. 5 illustrates the concept of channel combining and channel splitting for channel polarization.
Figure 5:
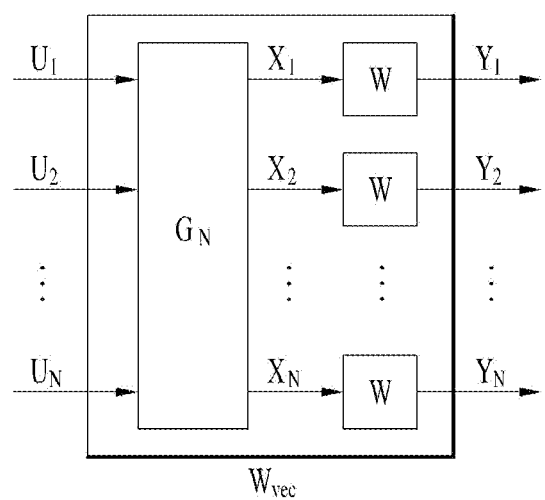

FIG. 5 illustrates the concept of channel combining and channel splitting for channel polarization. As illustrated in FIG. 5, when N copies of an original channel W are properly combined to create a vector channel Wvec and then are split into new polarized channels, the new polarized channels are categorized into channels having capacity C(W)=1 and channels having C(W)=0 if N is sufficiently large. In this case, since bits passing through the channels having the channel capacity C(W))=1 are transmitted without error, it is better to transmit information bits therethrough and, since bits passing through the channels having capacity C(W)=0 cannot transport information, it is better to transport frozen bits, which are meaningless bits, therethrough.

Referring to FIG. 5, copies of a given B-DMC W are combined in a recursive manner to output a vector channel $W_{vec}$ given by $X_N \to Y_N$, where $N=2^n$ and n is an integer equal to or greater than 0. Recursion always begins at the 0th level and $W_1$=W. If n is 1 (n=1), this means the first level of recursion in which two independent copies of $W_1$ are combined. If the above two copies are combined, a channel $W_2$: $X_2 \to Y_2$ is obtained. A transitional probability of this new channel $W_2$ may be represented by the following equation.

$$W_2(y_1,y_2|u_1,u_2)=W(y_1|u_1 \oplus u_2)W(y_1|u_2) \quad \text{Equation 3}$$

If the channel $W_2$ is obtained, two copies of the channel $W_2$ are combined to obtain a single copy of a channel $W_4$. Such recursion may be represented by $W_4$: $X_4 \to Y_4$ having the following transitional probability.

$$W_4(y_1^4|u_1^4)=W_2(y_1^2|u_1 \oplus u_2, u_3 \oplus u_4)W_2(y_3^4|u_2, u_4) \quad \text{Equation 4}$$

In FIG. 5, $G_N$ is a size-N generator matrix. $G_2$ corresponds to the base matrix F illustrated in FIG. 4(b). $G_4$ may be represented by the following matrix.

$$G_4 = \begin{bmatrix} 1 & 0 & 0 & 0 \\ 0 & 0 & 1 & 0 \\ 0 & 1 & 0 & 0 \\ 0 & 0 & 0 & 1 \end{bmatrix} \begin{bmatrix} 1 & 0 \\ 1 & 1 \end{bmatrix}^{\otimes 2} = \begin{bmatrix} 1 & 0 & 0 & 0 \\ 1 & 0 & 1 & 0 \\ 1 & 1 & 0 & 0 \\ 1 & 1 & 1 & 1 \end{bmatrix} \quad \text{Equation 5}$$

Herein, $\otimes$ denotes the Kronecker product, $A^{\otimes n}=A \otimes A^{\otimes(n-1)}$ for all n>1, and $A^{\otimes 0}=1$.

The relationship between input $u_1^N$ to $G_N$ and output $x_1^N$ of $G_N$ of FIG. 5(b) may be represented as $x_1^N=u_1^N G_N$, ere $x_1^N=\{x_1, \ldots, x_N\}$, $u_1^N=\{u_1, \ldots, u_N\}$ When N B-DMCs are combined, each B-DMC may be expressed in a recursive manner. That is, $G_N$ may be indicated by the following equation.

$$G_N=B_N F^{Wn} \quad \text{Equation 6}$$

Herein, $N=2^n$, $n \ge 1$, $F^{\otimes n}=F \otimes F^{\otimes(n-1)}$, and $F^{\otimes 0}=1$. BN is a permutation matrix known as a bit-reversal operation and $B_N = R_N(I_2 \otimes B_{N/2})$ and may be recursively computed. $I_2$ is a 2-dimensional identity matrix and this recursion is initialized to $B_2 = I_2$. $R_N$ is a bit-reversal interleaver and is used to map an input $s_1^N = \{s_1, \ldots, s_N\}$ to an output $x_1^N = \{s_1, s_3, \ldots, s_{n-1}, s_2, \ldots, s_N\}$. The bit-reversal interleaver may not be included in a transmitting side. The relationship of Equation is illustrated in FIG. 6.

Figure 6:
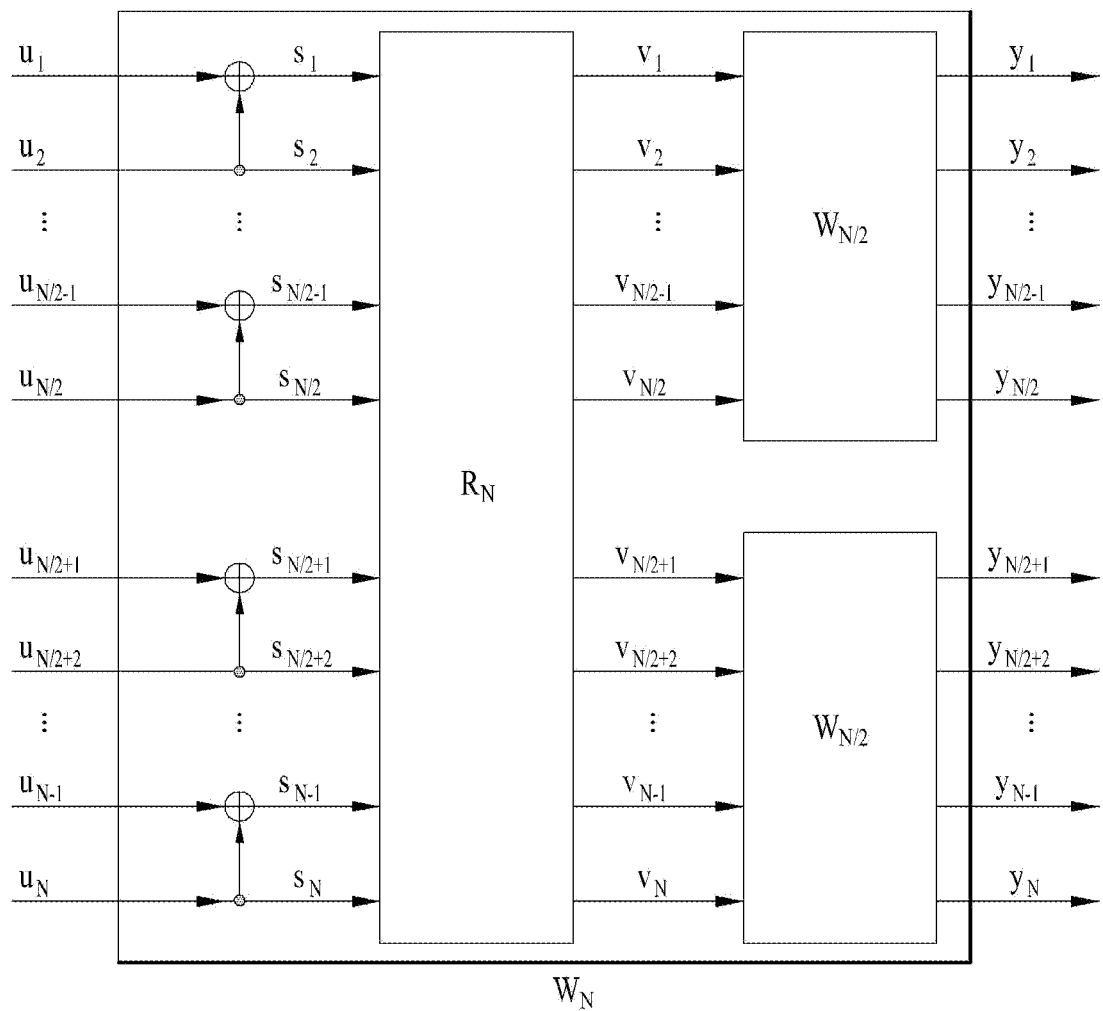
FIG. 6 illustrates N-th level channel combining for a polar code.

FIG. 6 illustrates N-th level channel combining for a polar code.

A process of defining an equivalent channel for specific input after combining N B-DMCs Ws is called channel splitting. Channel splitting may be represented as a channel transition probability indicated by the following equation.

$$W_N^i(y_1^N, u_1^{i-1} | u_i) = \sum_{u_{i+1}^N} \frac{1}{2^{N-1}} W_N(y_1^N | u_1^N) \qquad \text{Equation 7}$$

Channel polarization has the following characteristics:
>Conservation: $C(W^-) + C(W^+) = 2C(W)$,
>Extremization: $C(W^-) \leq C(W) \leq C(W^+)$.

When channel combining and channel splitting are performed, the following theorem may be obtained.

*Theorem: For any B-DMC W, channels $\{W_N^{(i)}\}$ are polarized in the following sense. For any fixed $\delta \in \{0,1\}$, as N goes to infinity through powers of 2, the fraction of indexes $i \in \{1, \ldots, N\}$ for channel capacity $I(W_N^{(i)}) \in (1-\delta, 1]$ goes to $I(W)$ and the faction of i for channel capacity $I(W_N^{(i)}) \in [0, \delta)$ goes to $1-(W)$. Hence, if $N \to \infty$, then channels are perfectly noisy or are polarized free of noise. These channels can be accurately recognized by the transmitting side. Therefore, bad channels are fixed and non-fixed bits may be transmitted on good channels.

That is, if the size N of polar codes is infinite, a channel has much noise or is free of noise, with respect to a specific input bit. This has the same meaning that the capacity of an equivalent channel for a specific input bit is divided into 0 or $I(W)$.

Inputs of a polar encoder are divided into bit channels to which information data is mapped and bit channels to which the information data is not mapped. As described earlier, according to the theorem of the polar code, if a codeword of the polar code goes to infinity, the input bit channels may be classified into noiseless channels and noise channels. Therefore, if information is allocated to the noiseless bit channels, channel capacity may be obtained. However, in actuality, a codeword of an infinite length cannot be configured, reliabilities of the input bit channels are calculated and data bits are allocated to the input bit channels in order of reliabilities. In the present disclosure, bit channels to which data bits are allocated are referred to as good bit channels. The good bit channels may be input bit channels to which the data bits are mapped. Bit channels to which data is not mapped are referred to as frozen bit channels. A known value (e.g., 0) is input to the frozen bit channels and then encoding is performed. Any values which are known to the transmitting side and the receiving side may be mapped to the frozen bit channels. When puncturing or repetition is performed, information about the good bit channels may be used. For example, positions of codeword bits (i.e., output bits) corresponding to positions of input bits to which information bits are not allocated may be punctured.

A decoding scheme of the polar codes is a successive cancellation (SC) decoding scheme. The SC decoding scheme obtains a channel transition probability and then calculates a likelihood ratio (LLR) of input bits using the channel transition probability. In this case, the channel transition probability may be calculated in a recursive form if channel combining and channel splitting procedures use characteristics of the recursive form. Therefore, a final LLR value may also be calculated in the recursive form. First, a channel transition probability $WN^{(i)}(y_1^N, u_1^{i-1}|u_1)$ of an input bit $u_i$ may be obtained as follows. $u_1^i$ may be split into odd indexes and even indexes as expressed as $u_{1,o}^i$, $u_{1,e}^i$, respectively. The channel transition probability may be indicated by the following equations.

$$W_{2N}^{(2i-1)}(y_1^{2N}, u_1^{2i-1} | u_{2i-1}) = \sum_{u_{2i}^{2N}} \frac{1}{2^{2N-1}} W_{2N}(y_1^{2N} | u_1^{2N}) = \qquad \text{Equation 8}$$

$$\sum_{u_{2i,o}^{2N}, u_{2i,e}^{2N}} \frac{1}{2^{2N-1}} W_N(y_1^N | u_{1,o}^{2N} \oplus u_{1,e}^{2N}) W_N(y_{N+1}^{2N} | u_{1,e}^{2N}) =$$

$$\sum_{u_{2i}} \frac{1}{2} \sum_{u_{2i+1,e}^{2N}} \frac{1}{2^{N-1}} W_N(y_{N+1}^{2N} | u_{1,e}^{2N}) \cdot$$

$$\sum_{u_{2i+1,o}^{2N}} \frac{1}{2^{N-1}} W_N(y_1^N | u_{1,o}^{2N} \oplus u_{1,e}^{2N}) =$$

$$\sum_{u_{2i}} \frac{1}{2} W_N^{(i)}(y_1^N, u_{1,o}^{2i-2} \oplus u_{1,e}^{2i-2} | u_{2i-1} \oplus u_{2i}) \cdot$$

$$W_N^{(i)}(y_{N+1}^{2N}, u_{1,e}^{2i-2} | u_{2i})$$

where $$W_N^{(i)}(y_1^N, u_1^{i-1} | u_i) = \sum_{u_{i+1}^N} \frac{1}{2^{N-1}} W_N(y_1^N | u_1^N).$$

$$W_{2N}^{(2i)}(y_1^{2N}, u_1^{2i-1} | u_{2i}) = \sum_{u_{2i+1}^{2N}} \frac{1}{2^{2N-1}} W_{2N}(y_1^{2N} | u_1^{2N}) = \qquad \text{Equation 9}$$

$$\sum_{u_{2i+1,o}^{2N}, u_{2i+1,e}^{2N}} \frac{1}{2^{2N-1}} W_N(y_1^N | u_{1,o}^{2N} \oplus u_{1,e}^{2N}) W_N(y_{N+1}^{2N} | u_{1,e}^{2N}) =$$

$$\frac{1}{2} \sum_{u_{2i+1,e}^{2N}} \frac{1}{2^{N-1}} W_N(y_{N+1}^{2N} | u_{1,e}^{2N}) \cdot$$

$$\sum_{u_{2i+1,o}^{2N}} \frac{1}{2^{N-1}} W_N(y_1^N | u_{1,o}^{2N} \oplus u_{1,e}^{2N}) =$$

$$\frac{1}{2} W_N^{(i)}(y_1^N, u_{1,o}^{2i-2} \oplus u_{1,e}^{2i-2} | u_{2i-1} \oplus u_{2i}) \cdot$$

$$W_N^{(i)}(y_{N+1}^{2N}, u_{1,e}^{2i-2} | u_{2i})$$

A polar decoder retrieves information and generates an estimate $\hat{u}_1^N$ of $u_1^N$ using values (e.g., reception bits, frozen bits, etc.) known for the polar codes. The LLR is defined as follows.

$$L_N^{(i)}(y_1^N, u_1^{i-1}) = \frac{W_N^{(i)}(y_1^N, u_1^{i-1} | u_i = 0)}{W_N^{(i)}(y_1^N, u_1^{i-1} | u_i = 1)} \qquad \text{Equation 10}$$

The LLR may be recursively calculated as follows.

$$L_N^{(2i-1)}(y_1^N, \hat{u}_1^{2i-2}) = \qquad \text{Equation 11}$$

-continued $$L_N^{(2i)}(y_1^N, \hat{u}_1^{2i-1}) = \frac{L_{N/2}^{(i)}(y_1^{N/2}, \hat{u}_{1,o}^{2i-2} \oplus \hat{u}_{1,e}^{2i-2}) \cdot L_{N/2}^{(i)}(y_{N/2+1}^N, \hat{u}_{1,e}^{2i-2}) + 1}{L_{N/2}^{(i)}(y_1^{N/2}, \hat{u}_{1,o}^{2i-2} \oplus \hat{u}_{1,e}^{2i-2}) + L_{N/2}^{(i)}(y_{N/2+1}^N, \hat{u}_{1,e}^{2i-2})}$$

$$[L_{N/2}^{(i)}(y_1^{N/2}, \hat{u}_{1,o}^{2i-2} \oplus \hat{u}_{1,e}^{2i-2})]^{1-2\hat{u}_{2i-1}} \cdot L_{N/2}^{(i)}(y_{N/2+1}^N, \hat{u}_{1,e}^{2i-2})$$

Recursive calculation of LLRs is traced back to a code length of 1 with an LLR $L_1^{(1)}(y_i) = W(y_i|0)/W(y_i|1)$. $L_1^{(1)}(y_i)$ is soft information observed from a channel.

The complexity of a polar encoder and an SC decoder varies with the length N of polar codes and is known as having O(N log N). Assuming that K input bits are used for a length-N polar code, a coding rate becomes N/K. If a generator matrix of a polar encoder of a data payload size N is $G_N$, an encoded bit may be represented as $x_1^N = u_1^N G_N$. It is assumed that K bits out of $u_1^N$ correspond to payload bits, a row index of $G_N$ corresponding to the payload bits is i, and a row index of $G_N$ corresponding to (N−K) bits is F. A minimum distance of the polar codes may be given as $d_{min}(C) = \min_{i \in F} 2^{wt(i)}$, where wt(i) is the number of 1s within binary extension of i and i=0,1, . . . ,N−1.

SC list (SCL) decoding is an extension of a basic SC decoder. In this type of decoder, L decoding paths are simultaneously considered in each decoding stage. Herein, L is an integer. In other words, in the case of the polar codes, a list-L decoding algorithm is an algorithm for simultaneously tracking L paths in a decoding process.

Figure 7:
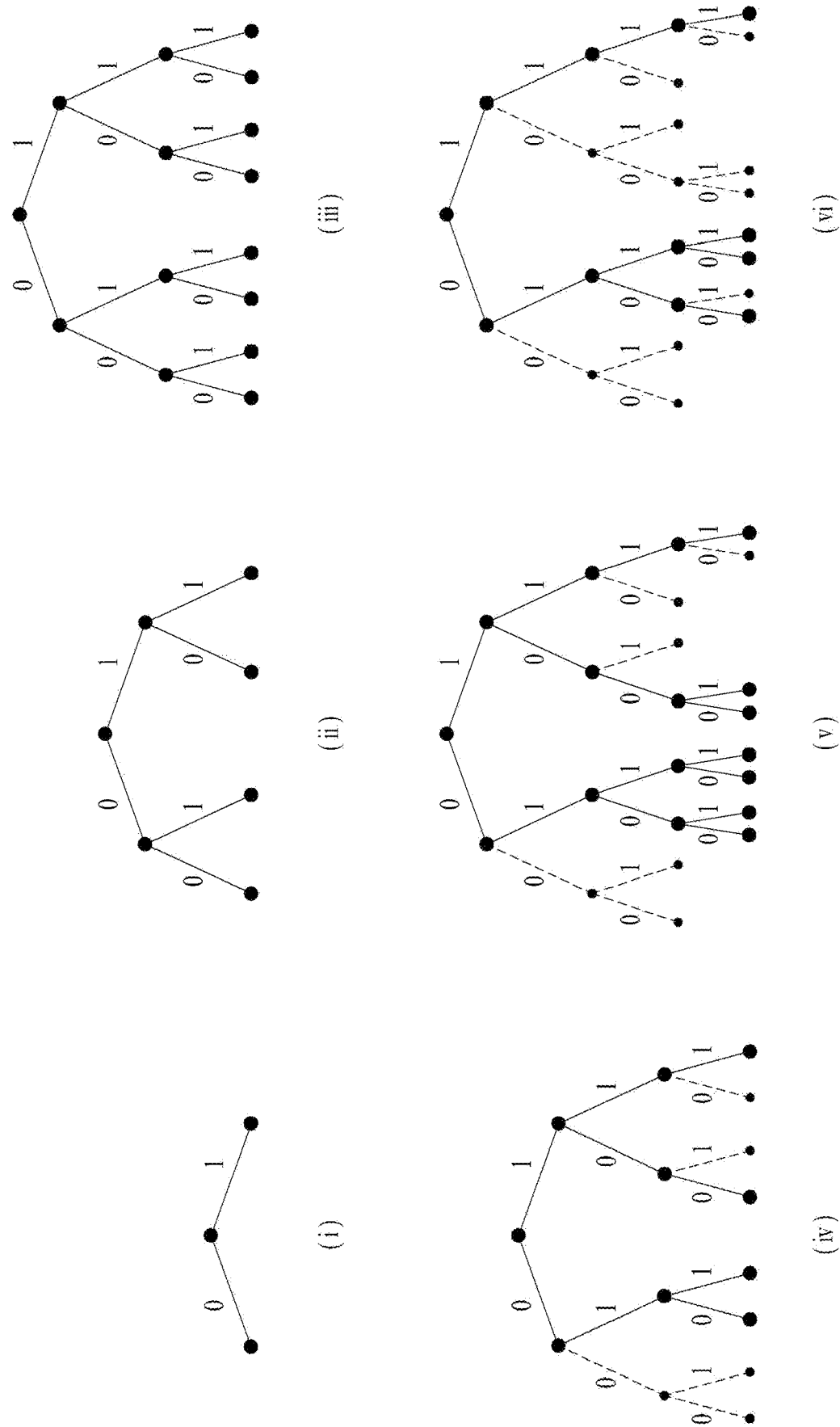
FIG. 7 illustrates an evolution of decoding paths in a list-L decoding process.

FIG. 7 illustrates an evolution of decoding paths in a list-L decoding process. For convenience of description, it is assumed that the number of bits that should be determined is n and all bits are not frozen. If a list size L is 4, each level includes at most 4 nodes with paths that continue downward. Discontinued paths are expressed by dotted lines in FIG. 7. A process in which decoding paths evolve in list-L decoding will now be described with reference to FIG. 7. i) If list-L decoding is started, the first unfrozen bit may be either 0 or 1. ii) list-L decoding continues. The second unfrozen bits may be either 0 or 1. Since the number of paths is not greater than L=4, pruning is not needed yet. iii) Consideration of all options for the first bit (i.e., a bit of the first level), the second bit (i.e. a bit of the second level), and the third bit (i.e., a bit of the third level) results in 8 decoding paths which are excessive because L=4. iv) the 8 decoding paths are pruned to L (=4) promising paths. v) 4 active paths continue by considering two options of the fourth unfrozen bit. In this case, the number of paths is doubled, i.e., 8 paths which are excessive because L=4. vi) The 8 paths are pruned back to L (=4) best paths. In the example of FIG. 7, 4 candidate codewords 0100, 0110, 0111, and 1111 are obtained and one of the codewords is determined to be a codeword most similar to an original codeword. In a similar manner to a normal decoding process, for example, in a pruning process or a process of determining a final codeword, a path in which the sum of LLR absolute values is largest may be selected as a survival path. If a CRC is present, the survival path may be selected through the CRC.

Meanwhile, CRC-aided SCL decoding is SCL decoding using CRC and improves the performance of polar codes. CRC is the most widely used technique in error detection and error correction in the field of information theory and coding. For example, if an input block of an error correction encoder has K bits and the length of information bits is k, and the length of CRC sequences is m bits, then K=k+m. CRC bits are a part of source bits for an error correction code. If the size of channel codes used for encoding is N, a code rate R is defined as R=K/N. CRC aided SCL decoding serves to detect an errorless path while a receiving device confirms a CRC code with respect to each path. An SCL decoder outputs candidate sequences to a CRC detector. The CRC detector feeds back a check result in order to aid in determining a codeword.

Although complicated as compared with an SC algorithm, SCL decoding or CRC aided SCL decoding has an advantage of excellent decoding performance. For more details of a list-X decoding algorithm of the polar codes, refer to 'I. Tal and A. Vardy, "List decoding of polar codes," in Proc. IEEE Int. Symp. Inf. Theory, pp. 1-5, July 2011'.

In the polar codes, code design is independent of a channel and hence is not versatile for mobile fading channels. In addition, the polar codes have a disadvantage of limited application because the codes have recently been introduced and have not grown yet. That is, polar coding proposed up to now has many parts that have not been defined to apply to a wireless communication system. Therefore, the present disclosure proposes a polar coding method suitable for the wireless communication system.

Figure 8:
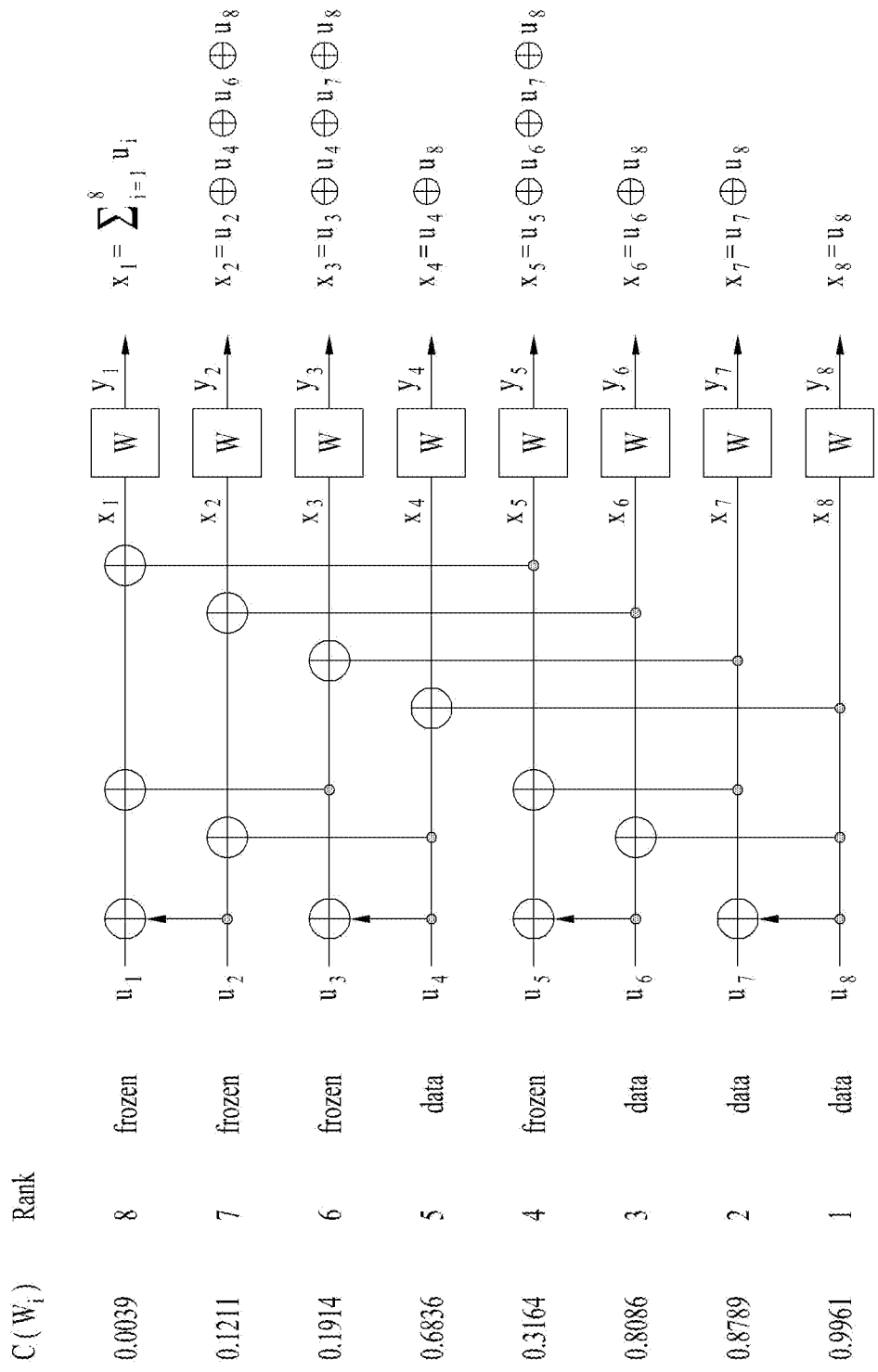
FIG. 8 illustrates the concept of selecting position(s) to which information bit(s) are to be allocated in polar codes.

FIG. 8 illustrates the concept of selecting position(s) to which information bit(s) are to be allocated in polar codes.

In FIG. 8, it is assumed that the size N of mother codes is 8, i.e., the size N of polar codes is 8, and a code rate is ½.

In FIG. 8, $C(W_i)$ denotes the capacity of a channel $W_i$ and corresponds to the reliability of channels that input bits of a polar code experience. When channel capacities corresponding to input bit positions of the polar code are as illustrated in FIG. 8, reliabilities of the input bit positions are ranked as illustrated in FIG. 8. To transmit data at a code rate of ½, a transmitting device allocates 4 bits constituting the data to 4 input bit positions having high channel capacities among 8 input bit positions (i.e., input bit positions denoted as $U_4$, $U_6$, $U_7$, and $U_8$ among input bit positions $U_1$ to $U_8$ of FIG. 8) and freezes the other input bit positions. A generator matrix $G_8$ corresponding to the polar code of FIG. 8 is as follows. The generator matrix $G_8$ may be acquired based on Equation 6.

$$G_8 = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} \quad \text{Equation 12}$$

The input bit positions denoted as $U_1$ to $U_8$ of FIG. 8 correspond one by one to rows from the highest row to the lowest row of $G_8$. Referring to FIG. 8, it may be appreciated that the input bit corresponding to $U_8$ affects all output coded bits. On the other hand, it may be appreciated that the input bit corresponding to $U_1$ affects only $Y_1$ among the output coded bits. Referring to Equation 12, when binary-input source bits $U_1$ to $U_8$ are multiplied by $G_8$, a row in which the input bits appear at all output bits is the lowest row [1, 1, 1, 1, 1, 1, 1, 1] in which all elements are 1, among rows of $G_8$. Meanwhile, a row in which the binary-input source bits appears at only one output bit is a row in which one element is 1 among the rows of $G_8$, i.e., a row [1, 0, 0, 0, 0, 0, 0, 0] in which a row weight is 1. Similarly, it may be appreciated that a row in which a row weight is 2 reflects input bits corresponding to the row in two output bits. Referring to FIG. 8 and Equation 12, $U_1$ to $U_8$ correspond one by one to the rows of $G_8$ and bit indexes for distinguishing between input positions of $U_1$ to $U_8$, i.e., bit indexes for distinguishing between the input positions, may be assigned to the rows of $G_8$.

Hereinafter, for Polar codes, it may be assumed that bit indexes from 0 to N−1 are sequentially allocated to rows of $G_N$ starting from the highest row having the smallest row weight with respect to N input bits. For example, referring to FIG. 8, a bit index 0 is allocated to the input position of $U_1$, i.e., the first row of $G_8$ and a bit index 7 is allocated to the input position of $U_8$, i.e., the last row of $G_8$. However, since the bit indexes are used to indicate input positions of the polar code, a scheme different from the above allocation scheme may be used. For example, bit indexes from 0 to N−1 may be allocated staring from the lowest row having the largest row weight.

In the case of output bit indexes, as illustrated in FIG. 8 and Equation 12, it may be assumed that bit indexes from 0 to N−1 or bit indexes from 1 to N are assigned to columns from the first column having the largest column weight to the last column having the smallest column weight among columns of $G_N$.

In Polar codes, setting of information bits and frozen bits is one of the most important elements in the configuration and performance of the polar code. That is, determination of ranks of input bit positions may be an important element in the performance and configuration of the polar code. For Polar codes, bit indexes may distinguish input or output positions of the polar code. In the present disclosure, a sequence obtained by enumerating reliabilities of bit positions in ascending or descending order are referred to as a bit index sequence. That is, the bit index sequence represents reliabilities of input or output bit positions of the polar code in ascending or descending order. A transmitting device inputs information bits to input bits having high reliabilities based on the input bit index sequence and performs encoding using the polar code. A receiving device may discern input positions to which information bits are allocated or input positions to which frozen bits are allocated, using the same or corresponding input bit index sequence. That is, the receiving device may perform polar decoding using an input bit index sequence which is identical to or corresponds to an input bit index sequence used by the transmitting device and using a corresponding polar code. In the following description, it may be assumed that an input bit index sequence is predetermined so that information bit(s) may be allocated to input bit position(s) having high reliabilities. In the present disclosure, the input bit index sequence is also called a Polar sequence.

Figure 9:
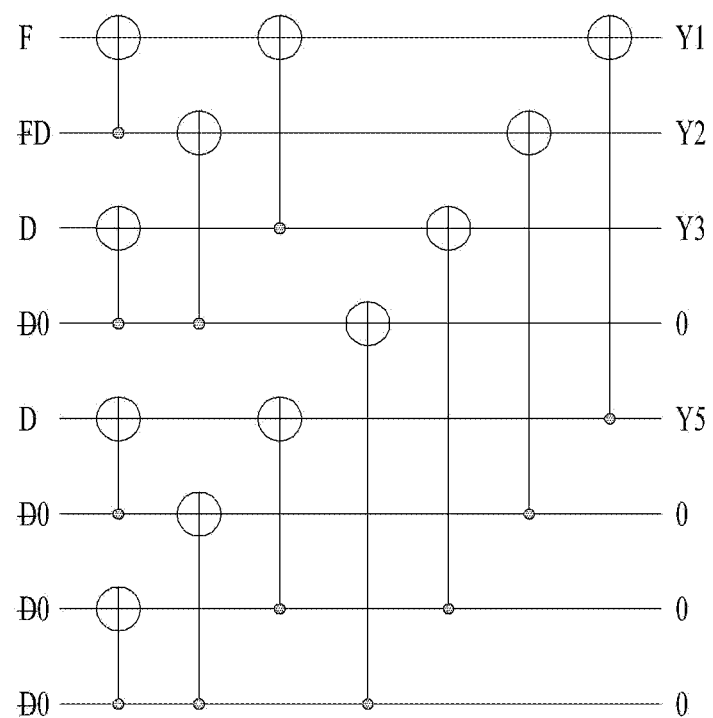
FIG. 9 illustrates puncturing and information bit allocation for Polar codes.

FIG. 9 illustrates puncturing and information bit allocation for polar codes. In FIG. 9, F denotes a frozen bit, D denotes an information bit, and 0 denotes a skipping bit.

Among coded bits, the case in which an information bit is changed to a frozen bit may occur according to an index or position of a punctured bit. For example, if output coded bits for a mother code of N=8 should be punctured in order of Y8, Y7, Y6, Y4, Y5, Y3, Y2, and Y1 and a target code rate is ½, then Y8, Y7, Y6, and Y4 are punctured, U8, U7, U6, and U4 connected only to Y8, Y7, Y6, and Y4 are frozen to 0, and these input bits are not transmitted, as illustrated in FIG. 9. An input bit changed to a frozen bit by puncturing of a coded bit is referred to as a skipping bit or a shortening bit and a corresponding input position is referred to as a skipping position or a shortening position. Shortening is a rate matching method of inserting a known bit into an input bit position connected to a position of an output bit desired to be transmitted while maintaining the size of input information (i.e., the size of information blocks). Shortening is possible starting from input corresponding to a column in which a column weight is 1 in a generator matrix $G_N$ and next shortening may be performed with respect to input corresponding to a column in which a column weight is 1 in a remaining matrix from which a column and row in which a column weight is 1 are removed. To prevent all information bits from being punctured, an information bit that should have been allocated to an information bit position may be reallocated in order of a high reliability within a set of frozen bit positions.

In the case of the polar code, decoding may be generally performed in the following order.

1. Bit(s) having low reliabilities are recovered first. Although reliability differs according to the structure of a decoder, since an input index in an encoder (hereinafter, an encoder input bit index or bit index) having a low value usually has a low reliability, decoding is generally performed staring from a low encoder input bit index.

2. When there is a known bit for a recovered bit, the known bit is used together with the recovered bit or the process of 1 is omitted and a known bit for a specific input bit position is immediately used, thereby recovering an information bit, which is an unknown bit. The information bit may be a source information bit (e.g., a bit of a transport block) or a CRC bit.

Figure 10:
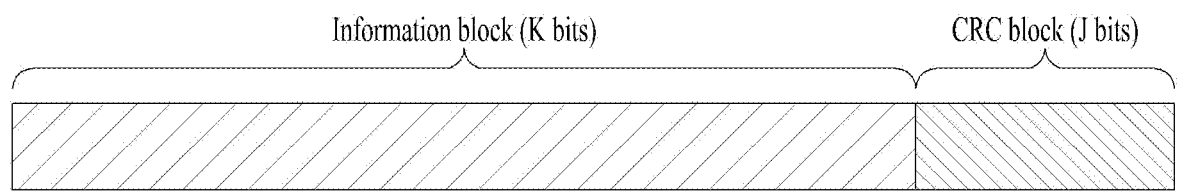
FIG. 10 illustrates the concept of a conventional cyclic redundancy check (CRC) code and a distributed CRC code.
Figure 10:
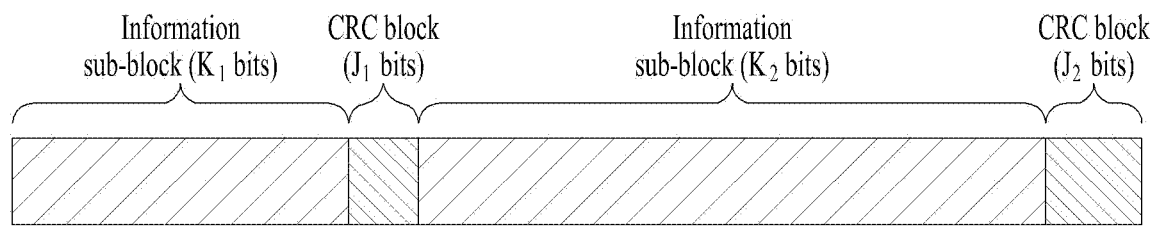

FIG. 10 illustrates the concept of a conventional CRC code and a distributed CRC code. FIG. 10(*a*) illustrates conventional CRC and FIG. 10(*b*) illustrates distributed CRC.

In Polar codes, a CRC-aided list (CAL) decoding method is widely used due to superior decoding performance thereof. According to the CAL decoding method, L (where, L is a positive integer) candidate information bit sequences {$u_i$: u−1, . . . ,L} are first decoded. Then, CRC-CHECK for the candidate information bit sequences is performed so that a candidate sequence passing CRC-CHECK is selected as a decoded information bit sequence.

Generally, CRC bits are positioned after information bits as illustrated in FIG. 10(*a*). Therefore, a decoder generally decodes all information bits and then performs CRC-CHECK for the decoded information bits. However, distributed CRC has recently been proposed to improve a decoding speed of the CAL decoding method. In distributed CRC, CRC bits are appropriately distributed over information bits as illustrated in FIG. 10(*b*). If distributed CRC is used as illustrated in FIG. 10(*b*), a decoder may decode a part (e.g., an information sub-block of $K_1$ bits) of information bits and a part (e.g., a CRC block of $J_1$ bits) in a CAL decoding process and perform CRC-CHECK using the decoded blocks. In this case, if CRC-CHECK for all the L candidate information bit sequences fails, the decoder may declare an error and stop decoding. That is, when distributed CRC is used, it is possible perform early termination of decoding in the CAL decoding process. If decoding of a received signal can be terminated early, a receiving device may rapidly determine whether the received signal is a signal therefor, and thus the receiving device increases speed for discovering a signal thereof. Furthermore, since an error of the received signal can be quickly discovered, retransmission for the received signal or next transmission following the received signal may be rapidly performed.

Figure 11:
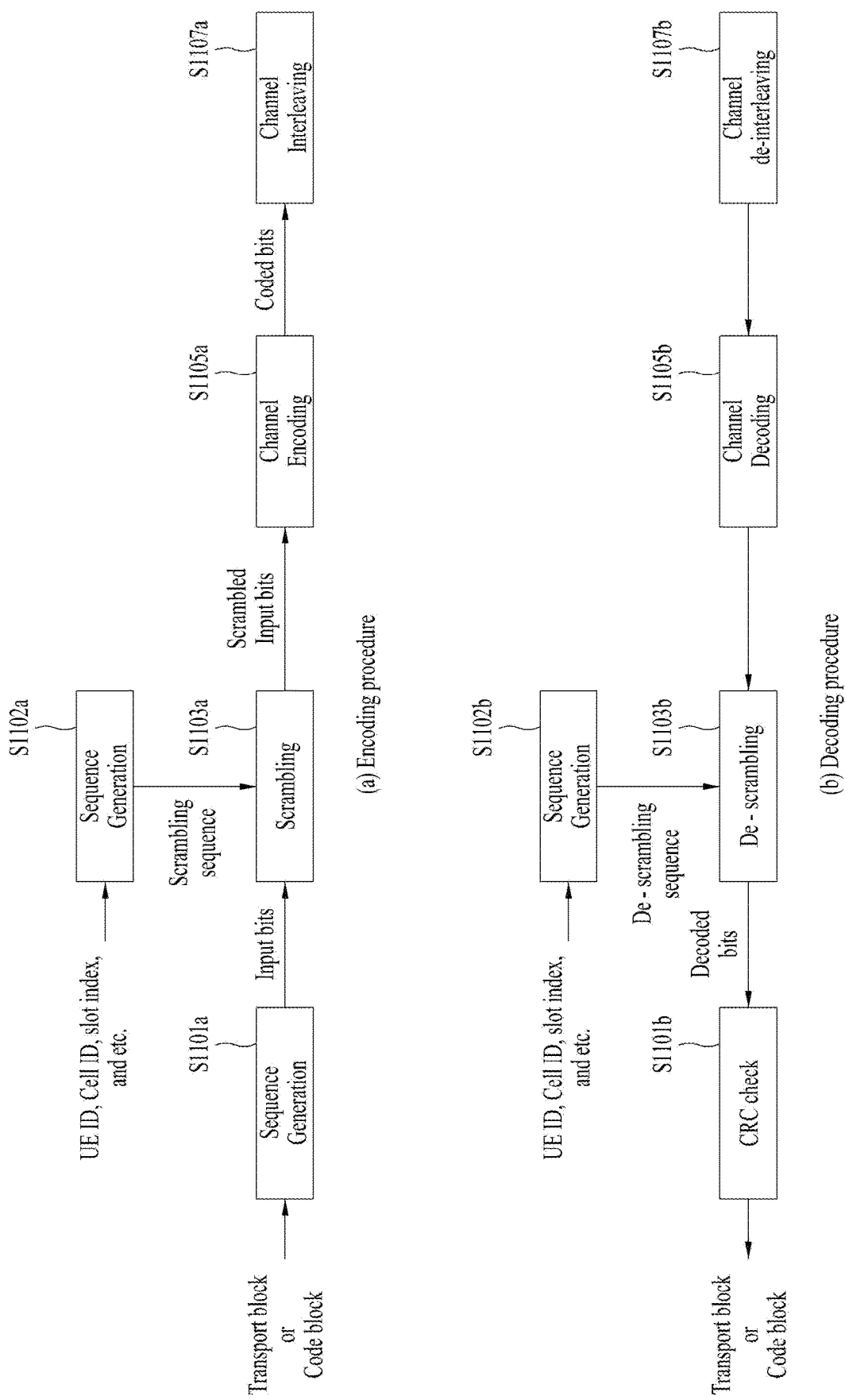
FIG. 11 illustrates an encoding procedure and a decoding procedure in a legacy LTE system.

FIG. 11 illustrates an encoding procedure and a decoding procedure in a legacy LTE system. Particularly, FIG. 11(*a*) illustrates an encoding procedure including a scrambling process and FIG. 11(b) illustrates a decoding procedure including a descrambling process.

Referring to FIG. 11(a), a transmitting device inserts a CRC code into a transport block or a code block (S1101a) and scrambles obtained input bits using a scrambling sequence (S1103a). The transmitting device channel-encodes the scrambled input bits (S1105a) to generate coded bits and channel-interleaves the coded bits (S1107a). Referring to FIG. 11(b), a receiving device obtains coded bits from received bits based on a channel interleaving pattern applied in the encoding procedure or a channel interleaving pattern corresponding thereto (S1107b) and channel-decodes the coded bits (S1105b) to obtain scrambled bits. The receiving device descrambles the scrambled bits using a scrambling sequence (S1103b) to obtain a sequence of decoded bits (hereinafter, a decoded bit sequence). The receiving device checks whether errors occur in the decoded bit sequence using CRC bits in the decoded bit sequence (S1101b). If CRC for the decoded bit sequence fails, the receiving device determines that decoding of a received signal has failed. If CRC for the decoded bit sequence is successful, the receiving device determines that the decoding procedure has succeeded and may obtain the transport block or the code block by eliminating the CRC bits from the decoded bit sequence.

In FIG. 11(a), CRC generation (S1101a), sequence generation (S1102a), scrambling (S1103a), channel encoding (S1105a), and channel interleaving (S1107a) may be performed by a CRC code generator, a sequence generator, a scrambler, a channel encoder, and a channel interleaver, respectively. The CRC code generator, the sequence generator, the scrambler, the channel encoder, and the channel interleaver may constitute a part of a processor of the transmitting device and may be configured to be operated under control of the processor of the transmitting device. In FIG. 11(b), CRC check (S1101b), sequence generation (S1102b), descrambling (S1103b), channel decoding (S1105b), and channel interleaving (S1107b) may be performed by a CRC checker, a sequence generator, a descrambler, a channel decoder, and a channel interleaver, respectively. The CRC checker, the sequence generator, the descrambler, the channel decoder, and the channel interleaver may constitute a part of a processor of the receiving device and may be configured to be operated under control the processor of the receiving device. In the legacy LTE system, the scrambler generates an m-sequence using a UE ID, a cell ID, and/or a slot index and then scrambles input bits consisting of information bits and CRC bits, which are input to the scrambler, using the m-sequence. The descrambler generates an m-sequence using a UE ID, a cell ID, and/or a slot index and then descrambles input bits consisting of information bits and CRC bits, which are input to the descrambler, using the m-sequence.

Some process(es) of the encoding procedure or some process(es) of the decoding procedure may be omitted according to types of transport channels or types of control information. Even in an NR system as well as the legacy LTE system, an encoding or decoding procedure similar to the encoding or decoding procedure illustrated in FIG. 11 is used. However, the LTE system and the NR system may use different coding schemes in the channel encoding/decoding process. For example, the legacy LTE system uses channel coding schemes listed in Table 1 and Table 2 below, whereas the NR system is expected to use an LDPC code and a Polar code for channel coding. Table 1 lists channel coding schemes and coding rates for transport blocks, used in the LTE system. Table 2 lists channel coding schemes and coding rates for control information, used in the LTE system.

TABLE 1

| TrCH | Coding scheme | Coding rate |
| --- | --- | --- |
| UL shared channel (UL-SCH) DL shared channel (DL-SCH) Paging channel (PCH) Multicast channel (MCH) Sidelink shared channel (SL-SCH) Sidelink discovery channel (SL-DCH) | Turbo coding | 1/3 |
| Broadcast channel (BCH) Sidelink broadcast channel (SL-BCH) | Tail biting convolutional coding | 1/3 |

TABLE 2

| Control Information | Coding scheme | Coding rate |
| --- | --- | --- |
| Downlink control information (DCI) | Tail biting convolutional coding | 1/3 |
| Control format indicator (CFI) | Block code | 1/16 |
| HARQ indicator (HI) | Repetition code | 1/3 |
| Uplink control information (UCI) | Block code Tail biting convolutional coding | variable 1/3 |
| Sidelink control information (SCI) | Tail biting convolutional coding | 1/3 |

Table 3 lists a channel coding scheme and a coding rate for a transport channel (TrCH), used in the NR system, and Table 4 lists a channel coding scheme and a coding rate for control information, used in the NR system.

TABLE 3

| TrCH | Coding scheme |
| --- | --- |
| UL-SCH DL-SCH PCH | LDPC |
| BCH | Polar code |

TABLE 4

| Control Information | Coding scheme |
| --- | --- |
| DCI | Polar code |
| UCI | Block code Polar code |

For more details of the encoding procedure and decoding procedure of the legacy LTE system, reference may be made to 3GPP TS 36.211, 3GPP TS 36.212, 3GPP 36.331, and/or 3GPP TS 36.331. For more details of the encoding procedure and decoding procedure of the NR system, reference may be made to 3GPP TS 38.211, 3GPP TS 38.212, 3GPP TS 38.213, 3GPP TS 38.214, and/or 3GPP TS 38.331.

Figure 12:
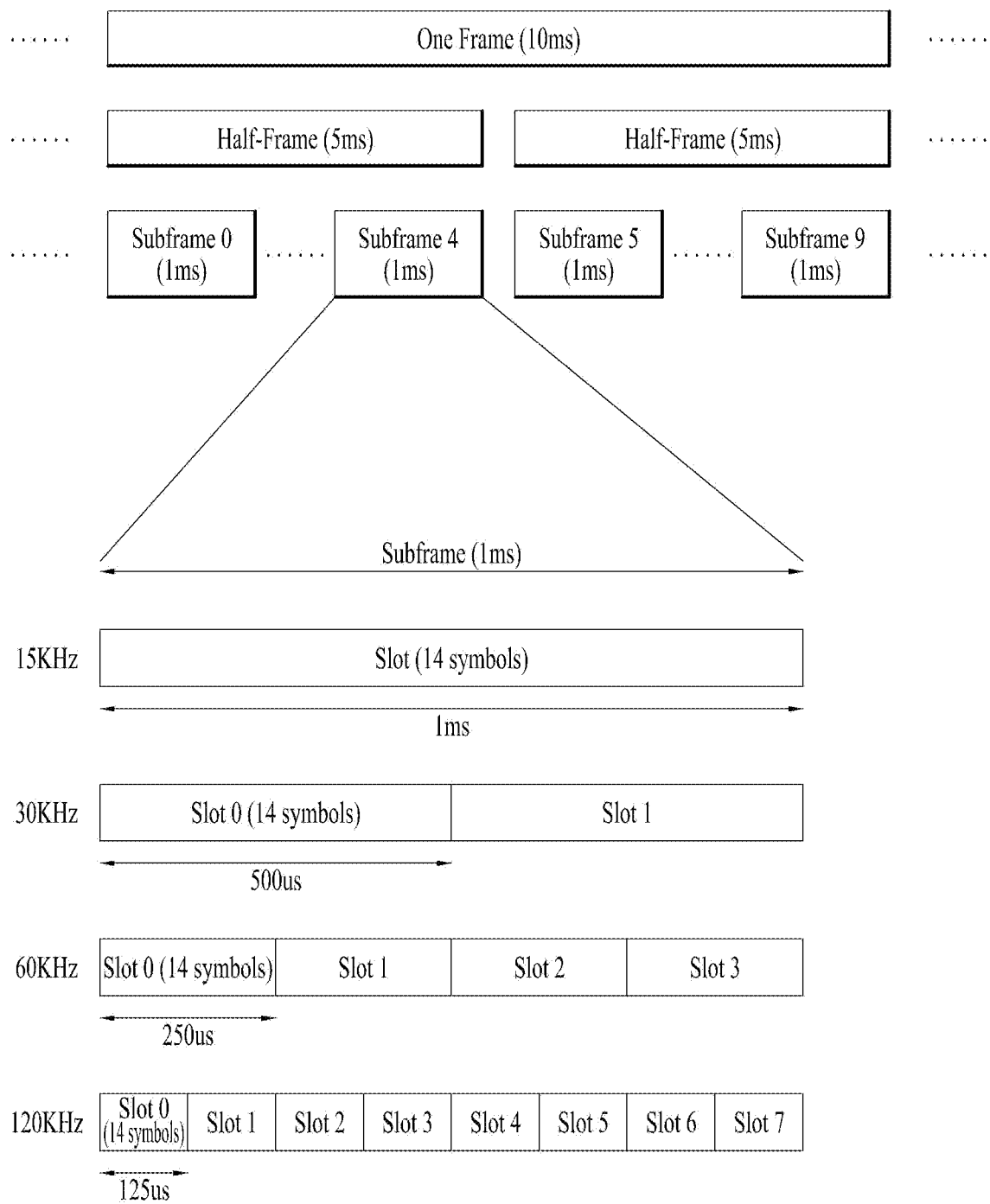
FIG. 12 illustrates a frame structure.

FIG. 12 illustrates a frame structure. The frame structure illustrated in FIG. 12 is purely exemplary and the number of subframes, the number of slots, and/or the number of symbols in a frame may be variously changed. In the NR system, an OFDM numerology (e.g., subcarrier spacing (SCS)) may be differently configured between a plurality of cells aggregated for one UE. Therefore, an (absolute time) duration of a time resource (e.g. a subframe, a slot, or a transmission time interval (TTI)) including the same number of symbols may be differently configured between the aggregated cells. Herein, symbols may include OFDM symbols (or CP-OFDM symbols), SC-FDMA symbols (or discrete Fourier transform-spread-OFDM (DFT-s-OFDM) symbols).

Referring to FIG. 12, in the NR system, downlink and uplink transmissions are organized into frames. Each frame has Tf=10 ms duration. Each frame is divided into two half-frames, where each of the half-frames has 5 ms duration. Each half-frame consists of 5 subframes, where the duration $T_{sf}$ per subframe is 1 ms. Each subframe is divided into slots and the number of slots in a subframe depends on a subcarrier spacing. Each slot includes 14 or 12 OFDM symbols based on a cyclic prefix (CP). In a normal CP, each slot includes 14 OFDM symbols and, in an extended CP, each slot includes 12 OFDM symbols. The following table shows the number of OFDM symbols per slot, the number of slots per frame, and the number of slots per for the normal CP, according to the subcarrier spacing $\Delta f = 2^u * 15$ kHz.

TABLE 5

| u | $N^{slot}_{symb}$ | $N^{frame,u}_{slot}$ | $N^{subframe,u}_{slot}$ |
|---|---|---|---|
| 0 | 14 | 10 | 1 |
| 1 | 14 | 20 | 2 |
| 2 | 14 | 40 | 4 |
| 3 | 14 | 80 | 8 |
| 4 | 14 | 160 | 16 |

The following table shows the number of OFDM symbols per slot, the number of slots per frame, and the number of slots per for the extended CP, according to the subcarrier spacing $\Delta f = 2^u * 15$ kHz.

TABLE 6

| u | $N^{slot}_{symb}$ | $N^{frame,u}_{slot}$ | $N^{subframe,u}_{slot}$ |
|---|---|---|---|
| 2 | 12 | 40 | 4 |

A slot includes plural symbols (e.g., 14 or 12 symbols) in the time domain. For each numerology (e.g. subcarrier spacing) and carrier, a resource grid of $N^{size,u}_{grid,x} * N^{RB}_{sc}$ subcarriers and $N^{subframe,u}_{symb}$ OFDM symbols is defined, starting at common resource block (CRB) $N^{start,u}_{grid}$ indicated by higher-layer signaling (e.g. radio resource control (RRC) signaling), where $N^{size,u}_{grid,x}$ is the number of resource blocks (RBs) in the resource grid and the subscript x is DL for downlink and UL for uplink. $N^{RB}_{sc}$ is the number of subcarriers per RB. In the 3GPP based wireless communication system, $N^{RB}_{sc}$ is 12 generally. There is one resource grid for a given antenna port p, subcarrier spacing configuration u, and transmission direction (DL or UL). The carrier bandwidth $N^{size,u}_{grid}$ for subcarrier spacing configuration u is given by the higher-layer parameter (e.g. RRC parameter). Each element in the resource grid for the antenna port p and the subcarrier spacing configuration u is referred to as a resource element (RE) and one complex symbol may be mapped to each RE. Each RE in the resource grid is uniquely identified by an index k in the frequency domain and an index l representing a symbol location relative to a reference point in the time domain. In the NR system, an RB is defined by 12 consecutive subcarriers in the frequency domain. In the NR system, RBs are classified into CRBs and physical resource blocks, (PRBs). CRBs are numbered from 0 and upwards in the frequency domain for subcarrier spacing configuration u. The center of subcarrier 0 of CRB 0 for subcarrier spacing configuration u coincides with 'point A' which serves as a common reference point for resource block grids. PRBs are defined within a bandwidth part (BWP). and numbered from 0 to $N^{size}_{BWP,i}-1$, where i is the number of the bandwidth part. The relation between the physical resource block $n_{PRB}$ in the bandwidth part i and the common resource block $n_{CRB}$ is as follows: $n_{PRB}=n_{CRB}+N^{size}_{BWP,i}$, where $N^{size}_{BWP,i}$ is the common resource block where bandwidth part starts relative to CRB 0. The BWP includes a plurality of consecutive RBs in a frequency domain. A carrier may include a maximum of N (e.g., 5) BWPs.

For data of a broadcast channel (BCH) transmitted/received through a physical broadcast channel (PBCH), downlink control information transmitted/received through a physical downlink control channel (PDCCH), and uplink control information (UCI) transmitted/received through a physical uplink control channel (PUCCH) or a physical uplink shared channel (PUSCH), a Polar code is used for channel coding in the NR system.

A Polar sequence (see the Polar sequence defined in 3GPP TS 38.212 V2.0.0) used in the NR system is shown below.
<Polar Sequence>

| W | I |
|---|---|
| 0 | 0 |
| 1 | 1 |
| 2 | 2 |
| 3 | 4 |
| 4 | 8 |
| 5 | 16 |
| 6 | 32 |
| 7 | 3 |
| 8 | 5 |
| 9 | 64 |
| 10 | 9 |
| 11 | 6 |
| 12 | 17 |
| 13 | 10 |
| 14 | 18 |
| 15 | 128 |
| 16 | 12 |
| 17 | 33 |
| 18 | 65 |
| 19 | 20 |
| 20 | 256 |
| 21 | 34 |
| 22 | 24 |
| 23 | 36 |
| 24 | 7 |
| 25 | 129 |
| 26 | 66 |
| 27 | 512 |
| 28 | 11 |
| 29 | 40 |
| 30 | 68 |
| 31 | 130 |
| 32 | 19 |
| 33 | 13 |
| 34 | 48 |
| 35 | 14 |
| 36 | 72 |
| 37 | 257 |

| W | I |
|---|---|
| 38 | 21 |
| 39 | 132 |
| 40 | 35 |
| 41 | 258 |
| 42 | 26 |
| 43 | 513 |
| 44 | 80 |
| 45 | 37 |
| 46 | 25 |
| 47 | 22 |
| 48 | 136 |
| 49 | 260 |
| 50 | 264 |
| 51 | 38 |
| 52 | 514 |
| 53 | 96 |
| 54 | 67 |
| 55 | 41 |
| 56 | 144 |
| 57 | 28 |
| 58 | 69 |
| 59 | 42 |
| 60 | 516 |
| 61 | 49 |
| 62 | 74 |
| 63 | 272 |
| 64 | 160 |
| 65 | 520 |
| 66 | 288 |
| 67 | 528 |
| 68 | 192 |
| 69 | 544 |
| 70 | 70 |
| 71 | 44 |
| 72 | 131 |
| 73 | 81 |
| 74 | 50 |
| 75 | 73 |
| 76 | 15 |
| 77 | 320 |
| 78 | 133 |
| 79 | 52 |
| 80 | 23 |
| 81 | 134 |
| 82 | 384 |
| 83 | 76 |
| 84 | 137 |
| 85 | 82 |
| 86 | 56 |
| 87 | 27 |
| 88 | 97 |
| 89 | 39 |
| 90 | 259 |
| 91 | 84 |
| 92 | 138 |
| 93 | 145 |
| 94 | 261 |
| 95 | 29 |
| 96 | 43 |
| 97 | 98 |
| 98 | 515 |
| 99 | 88 |
| 100 | 140 |
| 101 | 30 |
| 102 | 146 |
| 103 | 71 |
| 104 | 262 |
| 105 | 265 |
| 106 | 161 |
| 107 | 576 |
| 108 | 45 |
| 109 | 100 |
| 110 | 640 |
| 111 | 51 |
| 112 | 148 |
| 113 | 46 |
| 114 | 75 |
| 115 | 266 |
| 116 | 273 |
| 117 | 517 |
| 118 | 104 |
| 119 | 162 |
| 120 | 53 |
| 121 | 193 |
| 122 | 152 |
| 123 | 77 |
| 124 | 164 |
| 125 | 768 |
| 126 | 268 |
| 127 | 274 |
| 128 | 518 |
| 129 | 54 |
| 130 | 83 |
| 131 | 57 |
| 132 | 521 |
| 133 | 112 |
| 134 | 135 |
| 135 | 78 |
| 136 | 289 |
| 137 | 194 |
| 138 | 85 |
| 139 | 276 |
| 140 | 522 |
| 141 | 58 |
| 142 | 168 |
| 143 | 139 |
| 144 | 99 |
| 145 | 86 |
| 146 | 60 |
| 147 | 280 |
| 148 | 89 |
| 149 | 290 |
| 150 | 529 |
| 151 | 524 |
| 152 | 196 |
| 153 | 141 |
| 154 | 101 |
| 155 | 147 |
| 156 | 176 |
| 157 | 142 |
| 158 | 530 |
| 159 | 321 |
| 160 | 31 |
| 161 | 200 |
| 162 | 90 |
| 163 | 545 |
| 164 | 292 |
| 165 | 322 |
| 166 | 532 |
| 167 | 263 |
| 168 | 149 |
| 169 | 102 |
| 170 | 105 |
| 171 | 304 |
| 172 | 296 |
| 173 | 163 |
| 174 | 92 |
| 175 | 47 |
| 176 | 267 |
| 177 | 385 |
| 178 | 546 |
| 179 | 324 |
| 180 | 208 |
| 181 | 386 |
| 182 | 150 |
| 183 | 153 |
| 184 | 165 |
| 185 | 106 |
| 186 | 55 |
| 187 | 328 |
| 188 | 536 |
| 189 | 577 |
| 190 | 548 |
| 191 | 113 |

| W | I |
|---|---|
| 192 | 154 |
| 193 | 79 |
| 194 | 269 |
| 195 | 108 |
| 196 | 578 |
| 197 | 224 |
| 198 | 166 |
| 199 | 519 |
| 200 | 552 |
| 201 | 195 |
| 202 | 270 |
| 203 | 641 |
| 204 | 523 |
| 205 | 275 |
| 206 | 580 |
| 207 | 291 |
| 208 | 59 |
| 209 | 169 |
| 210 | 560 |
| 211 | 114 |
| 212 | 277 |
| 213 | 156 |
| 214 | 87 |
| 215 | 197 |
| 216 | 116 |
| 217 | 170 |
| 218 | 61 |
| 219 | 531 |
| 220 | 525 |
| 221 | 642 |
| 222 | 281 |
| 223 | 278 |
| 224 | 526 |
| 225 | 177 |
| 226 | 293 |
| 227 | 388 |
| 228 | 91 |
| 229 | 584 |
| 230 | 769 |
| 231 | 198 |
| 232 | 172 |
| 233 | 120 |
| 234 | 201 |
| 235 | 336 |
| 236 | 62 |
| 237 | 282 |
| 238 | 143 |
| 239 | 103 |
| 240 | 178 |
| 241 | 294 |
| 242 | 93 |
| 243 | 644 |
| 244 | 202 |
| 245 | 592 |
| 246 | 323 |
| 247 | 392 |
| 248 | 297 |
| 249 | 770 |
| 250 | 107 |
| 251 | 180 |
| 252 | 151 |
| 253 | 209 |
| 254 | 284 |
| 255 | 648 |
| 256 | 94 |
| 257 | 204 |
| 258 | 298 |
| 259 | 400 |
| 260 | 608 |
| 261 | 352 |
| 262 | 325 |
| 263 | 533 |
| 264 | 155 |
| 265 | 210 |
| 266 | 305 |
| 267 | 547 |
| 268 | 300 |

| W | I |
|---|---|
| 269 | 109 |
| 270 | 184 |
| 271 | 534 |
| 272 | 537 |
| 273 | 115 |
| 274 | 167 |
| 275 | 225 |
| 276 | 326 |
| 277 | 306 |
| 278 | 772 |
| 279 | 157 |
| 280 | 656 |
| 281 | 329 |
| 282 | 110 |
| 283 | 117 |
| 284 | 212 |
| 285 | 171 |
| 286 | 776 |
| 287 | 330 |
| 288 | 226 |
| 289 | 549 |
| 290 | 538 |
| 291 | 387 |
| 292 | 308 |
| 293 | 216 |
| 294 | 416 |
| 295 | 271 |
| 296 | 279 |
| 297 | 158 |
| 298 | 337 |
| 299 | 550 |
| 300 | 672 |
| 301 | 118 |
| 302 | 332 |
| 303 | 579 |
| 304 | 540 |
| 305 | 389 |
| 306 | 173 |
| 307 | 121 |
| 308 | 553 |
| 309 | 199 |
| 310 | 784 |
| 311 | 179 |
| 312 | 228 |
| 313 | 338 |
| 314 | 312 |
| 315 | 704 |
| 316 | 390 |
| 317 | 174 |
| 318 | 554 |
| 319 | 581 |
| 320 | 393 |
| 321 | 283 |
| 322 | 122 |
| 323 | 448 |
| 324 | 353 |
| 325 | 561 |
| 326 | 203 |
| 327 | 63 |
| 328 | 340 |
| 329 | 394 |
| 330 | 527 |
| 331 | 582 |
| 332 | 556 |
| 333 | 181 |
| 334 | 295 |
| 335 | 285 |
| 336 | 232 |
| 337 | 124 |
| 338 | 205 |
| 339 | 182 |
| 340 | 643 |
| 341 | 562 |
| 342 | 286 |
| 343 | 585 |
| 344 | 299 |
| 345 | 354 |

-continued

| W | I |
|---|---|
| 346 | 211 |
| 347 | 401 |
| 348 | 185 |
| 349 | 396 |
| 350 | 344 |
| 351 | 586 |
| 352 | 645 |
| 353 | 593 |
| 354 | 535 |
| 355 | 240 |
| 356 | 206 |
| 357 | 95 |
| 358 | 327 |
| 359 | 564 |
| 360 | 800 |
| 361 | 402 |
| 362 | 356 |
| 363 | 307 |
| 364 | 301 |
| 365 | 417 |
| 366 | 213 |
| 367 | 568 |
| 368 | 832 |
| 369 | 588 |
| 370 | 186 |
| 371 | 646 |
| 372 | 404 |
| 373 | 227 |
| 374 | 896 |
| 375 | 594 |
| 376 | 418 |
| 377 | 302 |
| 378 | 649 |
| 379 | 771 |
| 380 | 360 |
| 381 | 539 |
| 382 | 111 |
| 383 | 331 |
| 384 | 214 |
| 385 | 309 |
| 386 | 188 |
| 387 | 449 |
| 388 | 217 |
| 389 | 408 |
| 390 | 609 |
| 391 | 596 |
| 392 | 551 |
| 393 | 650 |
| 394 | 229 |
| 395 | 159 |
| 396 | 420 |
| 397 | 310 |
| 398 | 541 |
| 399 | 773 |
| 400 | 610 |
| 401 | 657 |
| 402 | 333 |
| 403 | 119 |
| 404 | 600 |
| 405 | 339 |
| 406 | 218 |
| 407 | 368 |
| 408 | 652 |
| 409 | 230 |
| 410 | 391 |
| 411 | 313 |
| 412 | 450 |
| 413 | 542 |
| 414 | 334 |
| 415 | 233 |
| 416 | 555 |
| 417 | 774 |
| 418 | 175 |
| 419 | 123 |
| 420 | 658 |
| 421 | 612 |
| 422 | 341 |

-continued

| W | I |
|---|---|
| 423 | 777 |
| 424 | 220 |
| 425 | 314 |
| 426 | 424 |
| 427 | 395 |
| 428 | 673 |
| 429 | 583 |
| 430 | 355 |
| 431 | 287 |
| 432 | 183 |
| 433 | 234 |
| 434 | 125 |
| 435 | 557 |
| 436 | 660 |
| 437 | 616 |
| 438 | 342 |
| 439 | 316 |
| 440 | 241 |
| 441 | 778 |
| 442 | 563 |
| 443 | 345 |
| 444 | 452 |
| 445 | 397 |
| 446 | 403 |
| 447 | 207 |
| 448 | 674 |
| 449 | 558 |
| 450 | 785 |
| 451 | 432 |
| 452 | 357 |
| 453 | 187 |
| 454 | 236 |
| 455 | 664 |
| 456 | 624 |
| 457 | 587 |
| 458 | 780 |
| 459 | 705 |
| 460 | 126 |
| 461 | 242 |
| 462 | 565 |
| 463 | 398 |
| 464 | 346 |
| 465 | 456 |
| 466 | 358 |
| 467 | 405 |
| 468 | 303 |
| 469 | 569 |
| 470 | 244 |
| 471 | 595 |
| 472 | 189 |
| 473 | 566 |
| 474 | 676 |
| 475 | 361 |
| 476 | 706 |
| 477 | 589 |
| 478 | 215 |
| 479 | 786 |
| 480 | 647 |
| 481 | 348 |
| 482 | 419 |
| 483 | 406 |
| 484 | 464 |
| 485 | 680 |
| 486 | 801 |
| 487 | 362 |
| 488 | 590 |
| 489 | 409 |
| 490 | 570 |
| 491 | 788 |
| 492 | 597 |
| 493 | 572 |
| 494 | 219 |
| 495 | 311 |
| 496 | 708 |
| 497 | 598 |
| 498 | 601 |
| 499 | 651 |

| W | I |
|---|---|
| 500 | 421 |
| 501 | 792 |
| 502 | 802 |
| 503 | 611 |
| 504 | 602 |
| 505 | 410 |
| 506 | 231 |
| 507 | 688 |
| 508 | 653 |
| 509 | 248 |
| 510 | 369 |
| 511 | 190 |
| 512 | 364 |
| 513 | 654 |
| 514 | 659 |
| 515 | 335 |
| 516 | 480 |
| 517 | 315 |
| 518 | 221 |
| 519 | 370 |
| 520 | 613 |
| 521 | 422 |
| 522 | 425 |
| 523 | 451 |
| 524 | 614 |
| 525 | 543 |
| 526 | 235 |
| 527 | 412 |
| 528 | 343 |
| 529 | 372 |
| 530 | 775 |
| 531 | 317 |
| 532 | 222 |
| 533 | 426 |
| 534 | 453 |
| 535 | 237 |
| 536 | 559 |
| 537 | 833 |
| 538 | 804 |
| 539 | 712 |
| 540 | 834 |
| 541 | 661 |
| 542 | 808 |
| 543 | 779 |
| 544 | 617 |
| 545 | 604 |
| 546 | 433 |
| 547 | 720 |
| 548 | 816 |
| 549 | 836 |
| 550 | 347 |
| 551 | 897 |
| 552 | 243 |
| 553 | 662 |
| 554 | 454 |
| 555 | 318 |
| 556 | 675 |
| 557 | 618 |
| 558 | 898 |
| 559 | 781 |
| 560 | 376 |
| 561 | 428 |
| 562 | 665 |
| 563 | 736 |
| 564 | 567 |
| 565 | 840 |
| 566 | 625 |
| 567 | 238 |
| 568 | 359 |
| 569 | 457 |
| 570 | 399 |
| 571 | 787 |
| 572 | 591 |
| 573 | 678 |
| 574 | 434 |
| 575 | 677 |
| 576 | 349 |

| W | I |
|---|---|
| 577 | 245 |
| 578 | 458 |
| 579 | 666 |
| 580 | 620 |
| 581 | 363 |
| 582 | 127 |
| 583 | 191 |
| 584 | 782 |
| 585 | 407 |
| 586 | 436 |
| 587 | 626 |
| 588 | 571 |
| 589 | 465 |
| 590 | 681 |
| 591 | 246 |
| 592 | 707 |
| 593 | 350 |
| 594 | 599 |
| 595 | 668 |
| 596 | 790 |
| 597 | 460 |
| 598 | 249 |
| 599 | 682 |
| 600 | 573 |
| 601 | 411 |
| 602 | 803 |
| 603 | 789 |
| 604 | 709 |
| 605 | 365 |
| 606 | 440 |
| 607 | 628 |
| 608 | 689 |
| 609 | 374 |
| 610 | 423 |
| 611 | 466 |
| 612 | 793 |
| 613 | 250 |
| 614 | 371 |
| 615 | 481 |
| 616 | 574 |
| 617 | 413 |
| 618 | 603 |
| 619 | 366 |
| 620 | 468 |
| 621 | 655 |
| 622 | 900 |
| 623 | 805 |
| 624 | 615 |
| 625 | 684 |
| 626 | 710 |
| 627 | 429 |
| 628 | 794 |
| 629 | 252 |
| 630 | 373 |
| 631 | 605 |
| 632 | 848 |
| 633 | 690 |
| 634 | 713 |
| 635 | 632 |
| 636 | 482 |
| 637 | 806 |
| 638 | 427 |
| 639 | 904 |
| 640 | 414 |
| 641 | 223 |
| 642 | 663 |
| 643 | 692 |
| 644 | 835 |
| 645 | 619 |
| 646 | 472 |
| 647 | 455 |
| 648 | 796 |
| 649 | 809 |
| 650 | 714 |
| 651 | 721 |
| 652 | 837 |
| 653 | 716 |

| W | I | W | I |
|---|---|---|---|
| 654 | 864 | 731 | 744 |
| 655 | 810 | 732 | 852 |
| 656 | 606 | 733 | 960 |
| 657 | 912 | 734 | 865 |
| 658 | 722 | 735 | 693 |
| 659 | 696 | 736 | 797 |
| 660 | 377 | 737 | 906 |
| 661 | 435 | 738 | 715 |
| 662 | 817 | 739 | 807 |
| 663 | 319 | 740 | 474 |
| 664 | 621 | 741 | 636 |
| 665 | 812 | 742 | 694 |
| 666 | 484 | 743 | 254 |
| 667 | 430 | 744 | 717 |
| 668 | 838 | 745 | 575 |
| 669 | 667 | 746 | 913 |
| 670 | 488 | 747 | 798 |
| 671 | 239 | 748 | 811 |
| 672 | 378 | 749 | 379 |
| 673 | 459 | 750 | 697 |
| 674 | 622 | 751 | 431 |
| 675 | 627 | 752 | 607 |
| 676 | 437 | 753 | 489 |
| 677 | 380 | 754 | 866 |
| 678 | 818 | 755 | 723 |
| 679 | 461 | 756 | 486 |
| 680 | 496 | 757 | 908 |
| 681 | 669 | 758 | 718 |
| 682 | 679 | 759 | 813 |
| 683 | 724 | 760 | 476 |
| 684 | 841 | 761 | 856 |
| 685 | 629 | 762 | 839 |
| 686 | 351 | 763 | 725 |
| 687 | 467 | 764 | 698 |
| 688 | 438 | 765 | 914 |
| 689 | 737 | 766 | 752 |
| 690 | 251 | 767 | 868 |
| 691 | 462 | 768 | 819 |
| 692 | 442 | 769 | 814 |
| 693 | 441 | 770 | 439 |
| 694 | 469 | 771 | 929 |
| 695 | 247 | 772 | 490 |
| 696 | 683 | 773 | 623 |
| 697 | 842 | 774 | 671 |
| 698 | 738 | 775 | 739 |
| 699 | 899 | 776 | 916 |
| 700 | 670 | 777 | 463 |
| 701 | 783 | 778 | 843 |
| 702 | 849 | 779 | 381 |
| 703 | 820 | 780 | 497 |
| 704 | 728 | 781 | 930 |
| 705 | 928 | 782 | 821 |
| 706 | 791 | 783 | 726 |
| 707 | 367 | 784 | 961 |
| 708 | 901 | 785 | 872 |
| 709 | 630 | 786 | 492 |
| 710 | 685 | 787 | 631 |
| 711 | 844 | 788 | 729 |
| 712 | 633 | 789 | 700 |
| 713 | 711 | 790 | 443 |
| 714 | 253 | 791 | 741 |
| 715 | 691 | 792 | 845 |
| 716 | 824 | 793 | 920 |
| 717 | 902 | 794 | 382 |
| 718 | 686 | 795 | 822 |
| 719 | 740 | 796 | 851 |
| 720 | 850 | 797 | 730 |
| 721 | 375 | 798 | 498 |
| 722 | 444 | 799 | 880 |
| 723 | 470 | 800 | 742 |
| 724 | 483 | 801 | 445 |
| 725 | 415 | 802 | 471 |
| 726 | 485 | 803 | 635 |
| 727 | 905 | 804 | 932 |
| 728 | 795 | 805 | 687 |
| 729 | 473 | 806 | 903 |
| 730 | 634 | 807 | 825 |

-continued

| W | I |
|---|---|
| 808 | 500 |
| 809 | 846 |
| 810 | 745 |
| 811 | 826 |
| 812 | 732 |
| 813 | 446 |
| 814 | 962 |
| 815 | 936 |
| 816 | 475 |
| 817 | 853 |
| 818 | 867 |
| 819 | 637 |
| 820 | 907 |
| 821 | 487 |
| 822 | 695 |
| 823 | 746 |
| 824 | 828 |
| 825 | 753 |
| 826 | 854 |
| 827 | 857 |
| 828 | 504 |
| 829 | 799 |
| 830 | 255 |
| 831 | 964 |
| 832 | 909 |
| 833 | 719 |
| 834 | 477 |
| 835 | 915 |
| 836 | 638 |
| 837 | 748 |
| 838 | 944 |
| 839 | 869 |
| 840 | 491 |
| 841 | 699 |
| 842 | 754 |
| 843 | 858 |
| 844 | 478 |
| 845 | 968 |
| 846 | 383 |
| 847 | 910 |
| 848 | 815 |
| 849 | 976 |
| 850 | 870 |
| 851 | 917 |
| 852 | 727 |
| 853 | 493 |
| 854 | 873 |
| 855 | 701 |
| 856 | 931 |
| 857 | 756 |
| 858 | 860 |
| 859 | 499 |
| 860 | 731 |
| 861 | 823 |
| 862 | 922 |
| 863 | 874 |
| 864 | 918 |
| 865 | 502 |
| 866 | 933 |
| 867 | 743 |
| 868 | 760 |
| 869 | 881 |
| 870 | 494 |
| 871 | 702 |
| 872 | 921 |
| 873 | 501 |
| 874 | 876 |
| 875 | 847 |
| 876 | 992 |
| 877 | 447 |
| 878 | 733 |
| 879 | 827 |
| 880 | 934 |
| 881 | 882 |
| 882 | 937 |
| 883 | 963 |
| 884 | 747 |

-continued

| W | I |
|---|---|
| 885 | 505 |
| 886 | 855 |
| 887 | 924 |
| 888 | 734 |
| 889 | 829 |
| 890 | 965 |
| 891 | 938 |
| 892 | 884 |
| 893 | 506 |
| 894 | 749 |
| 895 | 945 |
| 896 | 966 |
| 897 | 755 |
| 898 | 859 |
| 899 | 940 |
| 900 | 830 |
| 901 | 911 |
| 902 | 871 |
| 903 | 639 |
| 904 | 888 |
| 905 | 479 |
| 906 | 946 |
| 907 | 750 |
| 908 | 969 |
| 909 | 508 |
| 910 | 861 |
| 911 | 757 |
| 912 | 970 |
| 913 | 919 |
| 914 | 875 |
| 915 | 862 |
| 916 | 758 |
| 917 | 948 |
| 918 | 977 |
| 919 | 923 |
| 920 | 972 |
| 921 | 761 |
| 922 | 877 |
| 923 | 952 |
| 924 | 495 |
| 925 | 703 |
| 926 | 935 |
| 927 | 978 |
| 928 | 883 |
| 929 | 762 |
| 930 | 503 |
| 931 | 925 |
| 932 | 878 |
| 933 | 735 |
| 934 | 993 |
| 935 | 885 |
| 936 | 939 |
| 937 | 994 |
| 938 | 980 |
| 939 | 926 |
| 940 | 764 |
| 941 | 941 |
| 942 | 967 |
| 943 | 886 |
| 944 | 831 |
| 945 | 947 |
| 946 | 507 |
| 947 | 889 |
| 948 | 984 |
| 949 | 751 |
| 950 | 942 |
| 951 | 996 |
| 952 | 971 |
| 953 | 890 |
| 954 | 509 |
| 955 | 949 |
| 956 | 973 |
| 957 | 1000 |
| 958 | 892 |
| 959 | 950 |
| 960 | 863 |
| 961 | 759 |

-continued

| W | I |
|---|---|
| 962 | 1008 |
| 963 | 510 |
| 964 | 979 |
| 965 | 953 |
| 966 | 763 |
| 967 | 974 |
| 968 | 954 |
| 969 | 879 |
| 970 | 981 |
| 971 | 982 |
| 972 | 927 |
| 973 | 995 |
| 974 | 765 |
| 975 | 956 |
| 976 | 887 |
| 977 | 985 |
| 978 | 997 |
| 979 | 986 |
| 980 | 943 |
| 981 | 891 |
| 982 | 998 |
| 983 | 766 |
| 984 | 511 |
| 985 | 988 |
| 986 | 1001 |
| 987 | 951 |
| 988 | 1002 |
| 989 | 893 |
| 990 | 975 |
| 991 | 894 |
| 992 | 1009 |
| 993 | 955 |
| 994 | 1004 |
| 995 | 1010 |
| 996 | 957 |
| 997 | 983 |
| 998 | 958 |
| 999 | 987 |
| 1000 | 1012 |
| 1001 | 999 |
| 1002 | 1016 |
| 1003 | 767 |
| 1004 | 989 |
| 1005 | 1003 |
| 1006 | 990 |
| 1007 | 1005 |
| 1008 | 959 |
| 1009 | 1011 |
| 1010 | 1013 |
| 1011 | 895 |
| 1012 | 1006 |
| 1013 | 1014 |
| 1014 | 1017 |
| 1015 | 1018 |
| 1016 | 991 |
| 1017 | 1020 |
| 1018 | 1007 |
| 1019 | 1015 |
| 1020 | 1019 |
| 1021 | 1021 |
| 1022 | 1022 |
| 1023 | 1023 |

The above table shows a Polar sequence $Q_0^{Nmax-1}$ and a reliability $W(Q_i^{Nmax})$ of the Polar sequence. In the above table, W denotes $W(Q_i^{Nmax})$ and I denotes $Q_i^{Nmax}$. Namely, the Polar sequence $Q_0^{Nmax-1} = \{Q_0^{Nmax}, Q_1^{Nmax}, \ldots, Q_{Nmax-1}^{Nmax}\}$ is given by the above table, where $0 \leq Q_i^{Nmax} \leq Nmax-1$ denotes a bit index before Polar encoding for $i=0,1,\ldots$, Nmax−1 and Nmax=1024. The Polar sequence $Q_0^{Nmax-1}$ is ascending order of reliability $W(Q_0^{Nmax}) < W(Q_1^{Nmax}) < \ldots < W(Q_{Nmax-1}^{Nmax})$ denotes the reliability of bit index $Q_i^{Nmax}$. For example, referring to the above table, a reliability $W(Q_i^{Nmax})=3$ of a bit index $Q_i^{Nmax}=4$ is lower than a reliability $W(Q_i^{Nmax})=7$ of bit index $Q_i^{Nmax}=3$. That is, the above table lists, in ascending order of reliability, bit indexes 0 to 1023 which respectively indicate 1024 input positions of a Polar code of Nmax=1024. For any information block encoded to N bits, a same Polar sequence $Q_0^{N-1} = \{Q_0^N, Q_1^N, Q_2^N, \ldots, Q_{N-1}^N\}$ is used. The polar sequence $Q_0^{N-1}$ is a subset of Polar sequence $Q_0^{Nmax-1}$ with all elements $Q_i^{Nmax}$ of values less than N, ordered in ascending order of reliability $W(Q_0^N) < W(Q_1^N) < W(Q_2^N) < \ldots < W(Q_{N-1}^N)$. For example, when N=8, a Polar sequence $Q_0^7$ includes elements of $Q_i^{Nmax} < 8$ among elements of the Polar sequence $Q_0^{Nmax-1}$ and the elements of $Q_i^{Nmax} < 8$ are ordered in ascending order of reliability $W(0) < W(1) < W(2) < W(4) < W(3) < W(5) < W(6)$.

For example, Table 7 lists input bit positions for an information block of size K (=10) input to a Polar code in a Polar sequence of N=512.

TABLE 7

| | Polar sequence |
|---|---|
| 1 | 505 |
| 2 | 506 |
| 3 | 479 |
| 4 | 508 |
| 5 | 495 |
| 6 | 503 |
| 7 | 507 |
| 8 | 509 |
| 9 | 510 |
| 10 | 511 |

Table 7 shows 10 elements for K=10 among elements of the Polar sequence of N=512 in ascending order of reliability. Referring to the above-described table of <Polar sequence>, values of I having 10 reliabilities $W(Q_i^{Nmax})$ amoung values of I (=$Q_i^{Nmax}$) less than N=512 are {479, 495, 503, 505, 506, 507, 508, 509, 510, 511}. If {479, 495, 503, 505, 506, 507, 508, 509, 510, 511} are arranged in ascending order of reliability W, {505, 506, 479, 508, 495, 503, 507, 509, 510, 511}, which is a set of bit indexes for K=10 in the Polar sequence of N=512 shown in Table 7, may be obtained.

The following implementations of the present disclosure will be described based on the Polar sequence given by the <Polar sequence> of the above table.

When a bit sequence input to channel coding is represented as bits $c_0, c_1, c_2, c_3, \ldots, c_{k-1}$, bits after encoding the bits are represented as $d_0, d_1, d_2, d_3, \ldots, d_{n-1}$, where K is the number of bits to be encoded and $N=2^n$. In $N=2^2$, the value of n is determined by the following table.

TABLE 8

| If $E \leq (9/8) \cdot 2^{(\lceil \log_2 E \rceil - 1)}$ and $K / E < 9/16$ |
|---|
| $n_1 = \lceil \log_2 E \rceil - 1$; |
| else |
| $\quad n_1 = \lceil \log_2 E \rceil$; |
| end if |
| $R_{min} = 1/8$; |
| $n_2 = \lceil \log_2 (K / R_{min}) \rceil$; |
| $n = \max\{\min\{n_1, n_2, n_{max}\}, n_{min}\}$ |
| where $n_{min} = 5$. |

In Table 8, $n_{max}$ may be a value predetermined according to the type of a channel or control information and/or according to the number of information bits input to a channel coding block. For example, $n_{max}$ for a BCH may be predetermined as 9, $n_{max}$ for DCI may be predetermined as 9, and $n_{max}$ for UCI may be predetermined as 10.

In Table 8, E denotes a rate-matching output sequence length. The rate matching output sequence length E may be a value predetermined according to the type of a channel, according to the type of control information, according to the amount of resources to which the channel or the control information is mapped, and/or according to the number of code blocks used to transmit the control information. For example, the rate matching output sequence length for the BCH may be E=864, the rate matching output sequence length for the DCI may be E=864, the rate matching output sequence length E for the UCI may be a value predetermined through the number of OFDM symbols carrying the UCI, the number of RBs, a spreading factor, the number of code blocks for the UCI, and/or the type of the UCI included in a UCI payload (e.g., HARQ-ACK, a scheduling request (SR), channel state information (CSI), etc.

For any information block encoded to N bits, the same Polar sequence $Q_0^{n-1}=\{Q_0^N, Q_1^N, Q_2^N, \ldots, Q_{N-1}^N\}$ is used. The Polar sequence $Q_0^{N-1}$ is a subset of a Polar sequence $Q_0^{Nmax-1}$ with all elements $Q_i^{Nmax}$ of values less than N, ordered in ascending order of reliability $W(Q_0^N)<W(Q_1^N)<W(Q_2^N)<\ldots<W(Q_{N-1}^N)$.

In the NR system, under a specific condition, for example, when 18≤Polar code information size≤25, parity check bits for improving performance (e.g., block error rate (BLER)) in the case of using a Polar code are generated. Here, the Polar code information size K is the number of information bits encoded through Polar coding. For example, the total sum of code block+code block CRC bit(s) may be the Polar code information size.

A set of bit indices in the Polar sequence $Q_0^{N-1}$ is denoted as $\overline{Q}_I^N$ and a set of other bit indices in the Polar sequence $Q_0^{N-1}$ is denoted as $\overline{Q}_F^N$, where $|\overline{Q}_I^N|=K+n_{PC}$, $|\overline{Q}_F^N|=N-|\overline{Q}_I^N|$, and $n_{PC}$ is the number of parity check bits. In the present disclosure, |A| is the number of elements in a set S. $\overline{Q}_I^N$ and $\overline{Q}_F^N$ are given as follows.

TABLE 9

$\overline{Q}_{F,tmp}^N = \emptyset$
if E < N
    if K / E ≤ 7 / 16 -- puncturing
        for n = 0 to N − E − 1
            $\overline{Q}_{F,tmp}^N = \overline{Q}_{F,tmp}^N \cup \{J(n)\}$;
        end for
        if E ≥ 3N / 4
            $\overline{Q}_{F,tmp}^N = \overline{Q}_{F,tmp}^N \cup \{0,1,\ldots,[3N / 4 − E / 2]−1\}$;
    else
        $\overline{Q}_{F,tmp}^N = \overline{Q}_{F,tmp}^N \cup \{0,1,\ldots,[9N / 16 − E / 4]−1\}$;
    end if
else    -- shortening
    for n = E to N − 1
        $\overline{Q}_{F,tmp}^N = \overline{Q}_{F,tmp}^N \cup \{J(n)\}$;
    end for
end if
$\overline{Q}_{I,tmp}^N = Q_0^{N-1} \setminus \overline{Q}_{F,tmp}^N$;
$\overline{Q}_I^N$ comprises (K + $n_{PC}$) most reliable bit indices in $\overline{Q}_{I,tmp}^N$;
$\overline{Q}_F^N = Q_0^{N-1} \setminus \overline{Q}_I^N$;

In the present disclosure, A\B denotes the difference of set B from set A, i.e., A−B, and is the set of elements of set A that are not in set B.

In Table 9, J(n)=P(i)*(N/32)+mod(n, N/32), where n=floor(32n/N), and a sub-block interleaver pattern P(i) is given by the following table.

TABLE 10

| i | P(i) |
|---|---|
| 0 | 0 |
| 1 | 1 |
| 2 | 2 |
| 3 | 4 |
| 4 | 3 |
| 5 | 5 |
| 6 | 6 |
| 7 | 7 |
| 8 | 8 |
| 9 | 16 |
| 10 | 9 |
| 11 | 17 |
| 12 | 10 |
| 13 | 18 |
| 14 | 11 |
| 15 | 19 |
| 16 | 12 |
| 17 | 20 |
| 18 | 13 |
| 19 | 21 |
| 20 | 14 |
| 21 | 22 |
| 22 | 15 |
| 23 | 23 |
| 24 | 24 |
| 25 | 25 |
| 26 | 26 |
| 27 | 28 |
| 28 | 27 |
| 29 | 29 |
| 30 | 30 |
| 31 | 31 |

$G_N=(G_2)^{\otimes n}$ is an n-th Kronecker power of a matrix $G_2$, where $G_2$ is equal to the base matrix F illustrated in FIG. 4(b).

In the present disclosure, a set of bit indices for parity check bits is denoted as $Q^N_{PC}$ and a set of bit indices for other parity check bits among $Q^N_{PC}$ is denoted as $Q^N_{PC\_wm}$. Here, the size of the set $Q^N_{PC}$ is $|Q^N_{PC}|=n_{PC}$ and the size of the set $Q^N_{PC\_}$ is $|Q^N_{PC\_wm}|=n^{wm}_{PC}$. In current NR standard (see 3GPP TS 38.212 V2.0.0), a method of calculating $Q^N_{PC}$ and $Q^N_{PC\_wm\_}$ is described as follows.

For a bit index j where j=0,1, . . . , N−1, the j-th row of $G_N$ is denoted as $g_j$ and the row weight of $g_j$ is denoted as $w(g_j)$, where $w(g_j)$ is the number of ones in $g_j$. A number of $(n_{PC}-n^{wm}_{PC})$ parity check bits are placed in $(n_{PC}-n^{wm}_{PC})$ least reliable bit indices in $\overline{Q}_I^N$. A number of $n^{wm}_{PC}$ other parity check bits are placed in bit indices of a minimum row weight in $\tilde{Q}_I^N$, where $\tilde{Q}_I^N$ denotes the $(|\overline{Q}_I^N|-n_{PC})$ most reliable bit indices in $\overline{Q}_I^N$. If there are more than $n^{wm}_{PC}$ bit indices of the same minimum row weight in $\tilde{Q}_I^N$, the $n^{wm}_{PC}$ other parity check bits are placed in the $n^{wm}_{PC}$ bit indices of the highest reliability and the minimum row weight in $\overline{Q}_I^N$.

In other words, according to the current NR standard (see 3GPP TS 38.212 V2.0.0), the reliability of the row weight and/or bit indices of the matrix $G_N$ is needed to determine bit indices for parity check bits, and bit indices for the $(n_{PC}-n^{wm}_{PC})$ parity check bits are determined first using reliability. In this case, the $(n_{PC}-n^{wm}_{PC})$ parity check bits are placed in the least reliable bit indices in $\overline{Q}_I^N$. Bit indices for other $n^{wm}_{PC}$ parity check bits are selected from the $(|\overline{Q}_I^N|-n_{PC})$ most reliable bit indices in $\overline{Q}_I^N$. This may be expressed based on reliability as illustrated FIG. 13(a).

Figure 13:
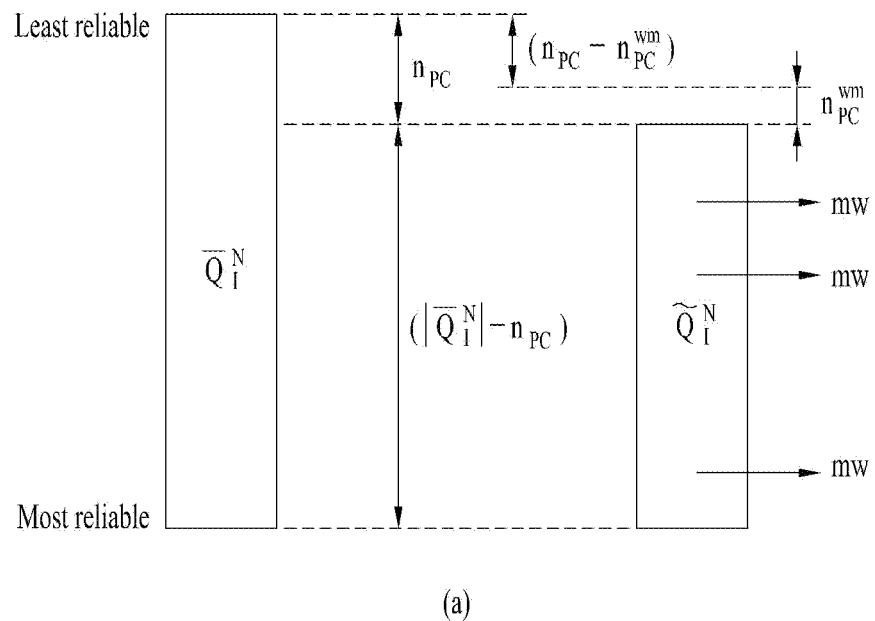
FIG. 13 illustrates input positions to a Polar code for parity check bits.
Figure 13:
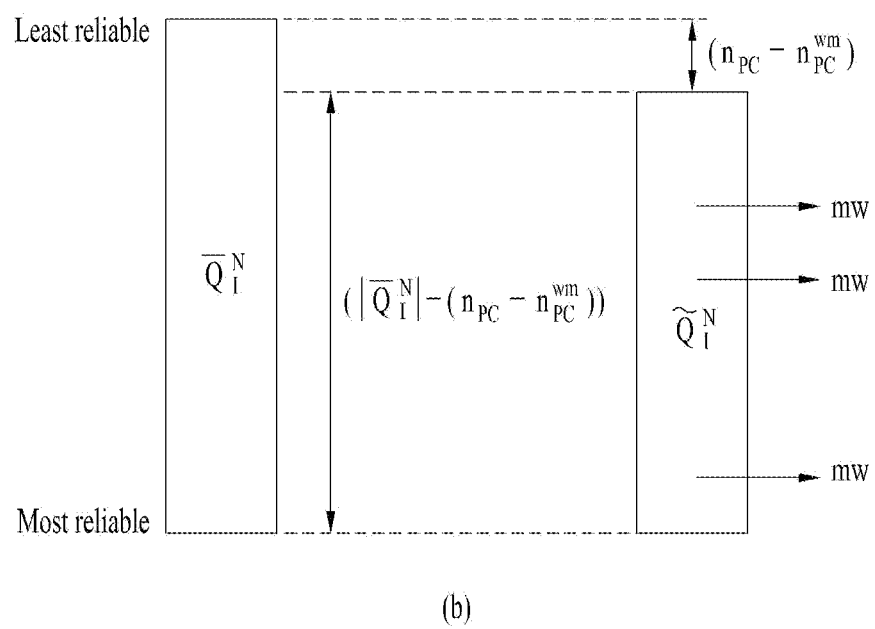

FIG. 13 illustrates input positions to a Polar code for parity check bits. Particularly, FIG. 13(a) illustrates a selection range of bit indices for parity check bits according to current NR standard and FIG. 13(b) illustrates a selection range of bit indices for parity check bits according to an implementation of the present disclosure. In FIG. 13, "mw" indicates a position with a minimum row weight among positions in a corresponding set.

Referring to FIG. 13(a), according to current NR standard, bit indices for parity check bits are selected only from a part except for $n^{wm}{}_{PC}$ bit positions in $\overline{Q}_I^N$. That is, according to current NR standard, parity check bits are not placed in the remaining $n^{wm}{}_{PC}$ bit indices except for ($n_{PC}$−$n^{wm}{}_{PC}$) least reliable bit indices and ($|\overline{Q}_I^N|$−$n_{PC}$) most reliable bit indices among bit indices in $\overline{Q}_I^N$.

However, since a matrix G has an extended type of a base matrix, a row weight becomes 1,2,2,4,2,4,4,8, 2,4,4,8,4,8,8,16 in row order so that the row weight is reduced in the row of a position of $2^n$, i.e., in a row with a row index equal to $2^n$ if the rows of the matrix G are indexed from 0. Although low reliable bit indices are not always mapped to low rows of the matrix G accurately, the row weight of low reliable rows is small on the whole. In other words, there is a high possibility that the rows of least reliable positions have a small row weight. Therefore, according to information size K or rate matching type, bit indices with a minimum row weight may appear at a part indicated by $n^{wm}{}_{PC}$ in FIG. 13(a). When parts of $n^{wm}{}_{PC}$ other parity check bits are placed in bit indices other than the bit indices with a minimum row weight, the encoding/decoding performance (e.g., BLER) based on a Polar code may be degraded.

Accordingly, in the present disclosure, it is proposed that the definition of $\tilde{Q}_I^N$ be changed to ($|\overline{Q}_I^N|$−($n_{PC}$−$n_{PC}^{wm}$)) most reliable bit indices in $\tilde{Q}_I^N$. According to the proposal of the present disclosure, since $n^{wm}{}_{PC}$ other parity check bits are placed in bit indices of a minimum row weight as much as possible, among the remaining bit indices excluding ($n_{PC}$−$n^{wm}{}_{PC}$) least reliable bit indices from bit indices for K+$n_{PC}$ bits, the encoding/decoding performance (e.g., BLER) based on the Polar code may be maximized.

Referring to FIG. 13(b), $\tilde{Q}_I^N$ according to an implementation of the present disclosure indicates the remaining region excluding bit indices for ($n_{PC}$−$n^{wm}{}_{PC}$) parity check bits from $\overline{Q}_I^N$. Therefore, $\tilde{Q}_I^N$ according to an implementation of the present disclosure indicates the same meaning as bit indices except for bit indices for the ($n_{PC}$−$n^{wm}{}_{PC}$) parity check bits in $\overline{Q}_I^N$, where $|\tilde{Q}_I^N|$=($|\overline{Q}_I^N|$−($n_{PC}$−$n_{PC}^{wm}$)).

According to an implementation of the present disclosure, if at least one (hereinafter, target parity check bit) among $n^{wm}{}_{PC}$ other parity check bits is placed in a bit position (hereinafter, a first target bit position) which is not placement targets of the $n^{wm}{}_{PC}$ other parity check bits in a placement method according to legacy standard, the first target bit position may have a lower row weight than a bit position (hereinafter, a second target bit position) at which the target parity check bit conforming to the placement method according to legacy standard has been placed or may be placed in the row of a lower position than the row of the second target bit position (i.e., in a lower bit index than a bit index of the second target position) even when the first target bit position has the same row weight as the second target bit position. For example, it is assumed that the row weight of the matrix G sequentially numerated from a low row is 1,2,2,4,2,4,4,8,2,4,4,8,4,8,8,16, the first target bit position according to an implementation of the present disclosure is a bit index 4 with a row weight of 2, and the second target bit position according to legacy standard is a bit index 9 with a row weight of 4. In this case, after the first target bit position, a row weight of '2' appears only once and the bit index of the first target bit position is lower than the bit index of the second target bit position with a row weight of '4'.

Therefore, in the placement method according to an implementation of the present disclosure, since only fewer bit indices and/or only a fewer number of times needs to be compared as compared with the placement method according to legacy standard, a smaller comparator than a comparator according to legacy standard may be advantageously used for channel coding using a Polar code.

In an implementation of the present disclosure, $n_{PC}$ and $n^{wm}{}_{PC}$ may be predetermined according to a condition, for example, according to an encoded channel or information type, a transport block or code block size, and the like. In addition, an implementation of the present disclosure may be applied not only to channel coding of a BCH, DCI, or UCI but also channel coding of other channels using the Polar code. In an implementation of the present disclosure, if $n_{PC}$ and $n^{wm}{}_{PC}$ are defined as values other than 0 with respect to not only for 18≤K≤25 but also for K of other ranges, the implement of the present disclosure may be applied.

K information bits including $n_{PC}$ parity check bits may be encoded based on $\overline{Q}_I^N$ and on $Q^N{}_{PC}$ according to an implementation of the present disclosure. Specifically, an input $u=[u_0, u_1, u_2 \ldots u_{N-1}]$ to the Polar code is generated as follows.

TABLE 11

```
k = 0;
if n_PC > 0
    y_0 = 0; y_1 = 0; y_2 = 0; y_3 = 0; y_4 = 0;
    for n = 0 to N − 1
        y_1 = y_0; y_0 = y_1; y_1 = y_2; y_2 = y_3; y_3 = y_4; y_4 = y_1;
        if n ∈ Q̄_I^N
            if n ∈ Q̄_PC^N
                u_n = y_0;
            else
                u_n = c_k';
                k = k + 1;
                y_0 = y_0 ⊕ u_n;
            end if
        else
            u_n = 0;
        end if
    end for
else
    for n = 0 to N − 1
        if n ∈ Q̄_I^N
            u_n = c_k';
            k = k + 1;
        else
            u_n = 0;
        end if
    end for
end if
```

Referring to Table 11, when n is not an element of $\overline{Q}_I^N$, then $u_n$=0 and $c'_k$ or $y_t$ is placed only in n which is the element of $\overline{Q}_I^N$. Here, $c'_k$ is a bit in a bit sequence input $c_0$, $c_1, c_2, c_3, \ldots, c_{K-1}$ to channel coding. $c'_k$ may be the bit of a CRC attachment transport block obtained by adding CRC bits to a transport block or the bit of a CRC attachment code block obtained by adding CRC bits to a code block. $y_t$ may be a parity check bit. $\overline{Q}_I^N$ may be a set of input positions of a Polar code for K information bits and $n_{PC}$ parity check bit(s), in other words, a set of bit indices of the Polar code for the K information bits and the $n_{PC}$ parity check bit(s).

An output $d=[d_0, d_1, d_2 \ldots d_{N-1}]$ after encoding is obtained by $d=uG_N$. Encoding is performed by GF(2).

Figure 14:
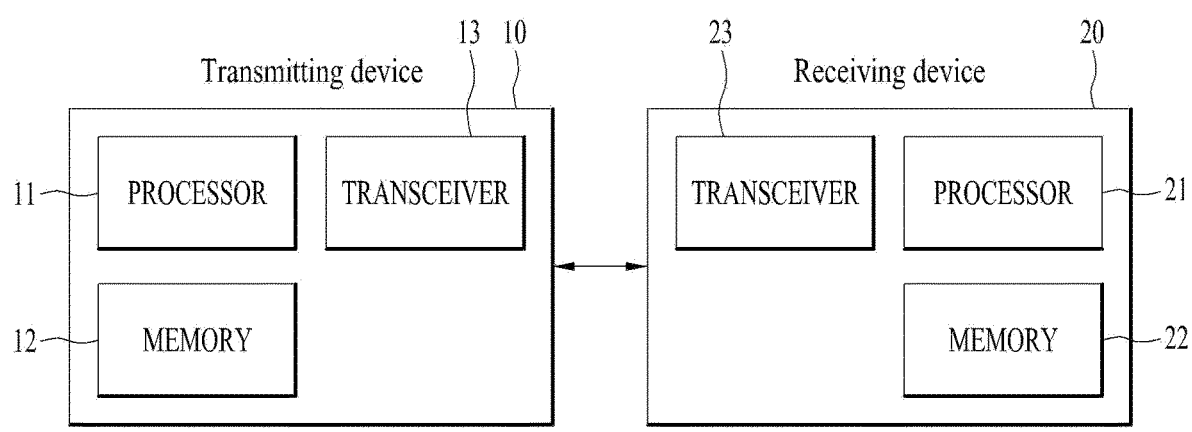
FIG. 14 is a block diagram illustrating elements of a transmitting device 10 and a receiving device 20 for implementing the present disclosure.

FIG. 14 is a block diagram illustrating elements of a transmitting device 10 and a receiving device 20 for implementing the present disclosure.

The transmitting device 10 and the receiving device 20 respectively include transceivers 13 and 23 capable of transmitting and receiving radio signals carrying information, data, signals, and/or messages, memories 12 and 22 for storing information related to communication in a wireless communication system, and processors 11 and 21 operationally connected to elements such as the transceivers 13 and 23 and the memories 12 and 22 to control the elements and configured to control the memories 12 and 22 and/or the transceivers 13 and 23 so that a corresponding device may perform at least one of the above-described examples of the present disclosure. The transceivers may also be referred to as radio frequency (RF) units.

The memories 12 and 22 may store programs for processing and controlling the processors 11 and 21 and may temporarily store input/output information. The memories 12 and 22 may be used as buffers.

The processors 11 and 21 generally control the overall operation of various modules in the transmitting device and the receiving device. Especially, the processors 11 and 21 may perform various control functions to implement the present disclosure. The processors 11 and 21 may be referred to as controllers, microcontrollers, microprocessors, or microcomputers. The processors 11 and 21 may be implemented by hardware, firmware, software, or a combination thereof. In a hardware configuration, application specific integrated circuits (ASICs), digital signal processors (DSPs), digital signal processing devices (DSPDs), programmable logic devices (PLDs), or field programmable gate arrays (FPGAs) may be included in the processors 11 and 21. Meanwhile, if the present disclosure is implemented using firmware or software, the firmware or software may be configured to include modules, procedures, functions, etc. performing the functions or operations of the present disclosure. Firmware or software configured to perform the present disclosure may be included in the processors 11 and 21 or stored in the memories 12 and 22 so as to be driven by the processors 11 and 21.

The processor 11 of the transmitting device 10 performs predetermined coding and modulation for a signal and/or data scheduled to be transmitted to the outside by the processor 11 or a scheduler connected with the processor 11, and then transfers the coded and modulated data to the transceiver 13. For example, the processor 11 converts a data stream to be transmitted into K layers through demultiplexing, channel coding, scrambling, and modulation. The coded data stream is also referred to as a codeword and is equivalent to a transport block which is a data block provided by a MAC layer. One transport block (TB) is coded into one codeword and each codeword is transmitted to the receiving device in the form of one or more layers. For frequency up-conversion, the transceiver 13 may include an oscillator. The transceiver 13 may include $N_t$ (where $N_t$ is a positive integer) transmit antennas.

A signal processing process of the receiving device 20 is the reverse of the signal processing process of the transmitting device 10. Under control of the processor 21, the transceiver 23 of the receiving device 20 receives radio signals transmitted by the transmitting device 10. The transceiver 23 may include Nr (where Nr is a positive integer) receive antennas and frequency down-converts each signal received through receive antennas into a baseband signal. The processor 21 decodes and demodulates the radio signals received through the receive antennas and restores data that the transmitting device 10 intended to transmit.

The transceivers 13 and 23 include one or more antennas. An antenna performs a function for transmitting signals processed by the transceivers 13 and 23 to the exterior or receiving radio signals from the exterior to transfer the radio signals to the transceivers 13 and 23. The antenna may also be called an antenna port. Each antenna may correspond to one physical antenna or may be configured by a combination of more than one physical antenna element. The signal transmitted from each antenna cannot be further deconstructed by the receiving device 20. An RS transmitted through a corresponding antenna defines an antenna from the view point of the receiving device 20 and enables the receiving device 20 to derive channel estimation for the antenna, irrespective of whether the channel represents a single radio channel from one physical antenna or a composite channel from a plurality of physical antenna elements including the antenna. That is, an antenna is defined such that a channel carrying a symbol of the antenna can be obtained from a channel carrying another symbol of the same antenna. A transceiver supporting a MIMO function of transmitting and receiving data using a plurality of antennas may be connected to two or more antennas.

The transmitting device 10 or the processor 11 thereof may be configured to include a Polar encoder to perform implementation(s) of the present disclosure and the receiving device 20 or the processor 21 thereof may be configured to include a Polar decoder to perform implementation(s) of the present disclosure.

In a few scenarios, functions, procedures, and/or methods disclosed in this specification may be implemented by a processing chip. The processing chip may be called a system-on-chip (SoC) or a chipset. The processing chip may include at least one processor and at least one memory and may be mounted or installed in each of the communication devices 10 and 20. The processing chip may be configured to perform or control any one of the methods and examples disclosed in the present specification or such methods or examples may be performed by a communication device in or to which the processing chip is mounted/installed or connected. The transmitting device 10 and/or the receiving device 20 illustrated in FIG. 14 may be the communication device. The memory included in the processing chip may be configured to store software code or programs including indications causing the processor or the communication device to perform some or all of the functions, methods, and examples disclosed in the present specification when being executed by the processor or the communication device. The memory included in the processing chip may be configured to store or buffer information or data generated by the processor of the processing chip or information recovered or obtained by the processor of the processing chip. One or more processes involving transmission or reception of the information or the data may be performed by the processor or under control of the processor. For example, the processor may transmit a signal including information or data to a transceiver operably connected to or coupled to the processing chip or control the transceiver to transmit a radio signal including the information or data. The processor may be configured to receive a signal including information or data from the transceiver operably connected to or coupled to the processing chip and obtain the information or data from the signal.

The processor 11 connected to or mounted on the transmitting device 10 may be configured to encode K-bit information based on a Polar sequence shared between the transmitting device and the receiving device. Before the information is encoded, $n_{PC}$ parity check bits may be added to the information. In this case, information consisting of $K+n_{PC}$ bits may be input to a channel coding block for Polar encoding. The $K+n_{PC}$ bits are mapped to bit positions, i.e., bit indexes, of a Polar code and are encoded based on the Polar code. The processor may be configured to place $K+n_{PC}$ bits in the Polar code and encode the $K+n_{PC}$ bits based on the Polar code. Particularly, the processor 11 is configured to place $(n_{PC}-n^{wm}_{PC})$ parity check bits among the $n_{PC}$ parity check bits in $(n_{PC}-n^{wm}_{PC})$ least reliable bit indices in a set of bit indices for the $K+n_{PC}$ bits among bit indices of the Polar code. The processor 11 is configured to place $n^{wm}_{PC}$ other parity check bits among the $n_{PC}$ parity check bits in the remaining bit indices excluding the $(n_{PC}-n^{wm}_{PC})$ least reliable bit indices from the set of the bit indices. The processor 11 is configured to place the $n^{wm}_{PC}$ other parity check bits in $n^{wm}_{PC}$ bit indices with a minimum low weight among the remaining bit indices. The processor 11 may transmit the encoded information. The processor 11 may control the transceiver 13 connected to the processor 11 to transmit the encoded information.

If the number of indices with a minimum row weight is larger than $n^{wm}_{PC}$, the processor 11 may be configured to place the $n^{wm}_{PC}$ other parity check bits in $n^{wm}_{PC}$ most reliable bit indices among the bit indices with the equal minimum row weight.

The processor 21 connected to or mounted on the receiving device 20 receives the encoded information. The processor 21 may decode the encoded information based on the Polar code. The processor 21 may be configured to decode the encoded information based on a mapping relationship between $K+n_{PC}$ bits and bit indices of the Polar code. The mapping relationship may be as follows: parity check bits are placed in $(n_{PC}-n^{wm}_{PC})$ least reliable bit indices in a set of bit indices for the $K+n_{PC}$ bits, and $n^{wm}_{PC}$ other parity check bits among the $n_{PC}$ parity check bits are placed in $n^{wm}_{PC}$ bit indices with a minimum row weight among the remaining bit indices excluding the $(n_{PC}-n^{wm}_{PC})$ least reliable bit indices from the set of the bit indices. The mapping relationship may also be as follows: if the number of bit indices with the equal minimum row weight is larger than $n^{wm}_{PC}$, the $n^{wm}_{PC}$ other parity check bits are placed in $n^{wm}_{PC}$ most reliable bit indices among the bit indices with the equal minimum row weight.

The $K+n_{PC}$ bit indices among a total of N bit indices of the Polar code may be determined based on a predefined Polar sequence. The predefined Polar sequence may include a sequence that places bit indices 0 to N−1 corresponding one by one to bit positions 0 to N−1 of the Polar code in ascending order of reliability.

As described above, the detailed description of the preferred implementation examples of the present disclosure has been given to enable those skilled in the art to implement and practice the disclosure. Although the disclosure has been described with reference to exemplary examples, those skilled in the art will appreciate that various modifications and variations can be made in the present disclosure without departing from the spirit or scope of the disclosure described in the appended claims. Accordingly, the disclosure should not be limited to the specific examples described herein, but should be accorded the broadest scope consistent with the principles and novel features disclosed herein.

Examples of the present disclosure may be used for a processing chip connected to or mounted in a BS, a UE, or a communication device in a wireless communication system, or for other equipment.

The invention claimed is:

1. A method of transmitting information by a transmitting device in a wireless communication system, the method comprising:

mapping input information of K+n bits to a Polar code, where K and n are positive integers;

encoding the input information based on the Polar code; and transmitting the encoded input information, wherein the input information includes n parity check bits, and wherein n1 parity check bits among the n parity check bits are mapped to n1 least reliable bit positions among K+n bit positions of the Polar code, and n−n1 parity check bits among the n parity check bits are mapped to n−n1 bit positions with a minimum row weight among K+n−n1 bit positions except for the n1 least reliable bit positions among the K+n bit positions, where n1 is a positive integer, and n−n1>0.

2. The method of claim 1, wherein the n−n1 parity check bits are mapped to n−n1 most reliable bit positions among bit positions with an equal minimum row weight, based on there being greater than n−n1 bit positions with the equal minimum row weight.

3. The method of claim 1, wherein the K+n bit positions among a total of N bit positions of the Polar code are determined based on a predefined Polar sequence, and wherein N is a positive integer greater than K+n.

4. The method of claim 3, wherein the predefined Polar sequence includes a sequence ordering bit indices 0 to N−1 corresponding one by one to bit positions 0 to N−1 of the Polar code in ascending order of reliability.

5. A method of receiving information by a receiving device in a wireless communication system, the method comprising:

receiving encoded information; and decoding the encoded information based on a Polar code, wherein the encoded information is decoded based on a mapping relationship between input information of K+n bits and bit positions of the Polar code, where K and n are positive integers, wherein the input information includes n parity check bits, and wherein the mapping relationship comprises:

mapping n1 parity check bits among the n to n1 least reliable bit positions among K+n bit positions of the Polar code, and mapping n−n1 parity check bits among the n parity check bits to n−n1 bit positions with a minimum row weight among K+n−n1 bit positions except for the n1 least reliable bit positions among the K+n bit positions, where n1 is a positive integer, and n−n1>0.

6. The method of claim 5, wherein in the mapping relationship: the n−n1 parity check bits are mapped to n−n1 most reliable bit positions among bit positions with an equal minimum row weight, based on there being greater than n−n1 bit positions with the equal minimum row weight.

7. A transmitting device for transmitting information in a wireless communication system, the transmitting device comprising:

a transceivers;

a processor; and a memory storing at least one program that causes the processor to erform operations comprising:

mapping input information of K+n bits to a Polar code, where K and n are positive integers;

encoding the input information based on the Polar code; and transmitting the encoded input information, wherein the input information includes n parity check bits, and wherein n1 parity check bits among the n parity check bits are mapped to n1 least reliable bit positions among K+n bit positions of the Polar code, and n−n1 parity check bits among the n parity check bits are mapped to n−n1 bit positions with a minimum row weight among K+n−n1 bit positions except for the n1 least reliable bit positions among the K+n bit positions, where n1 is a positive integer, and n−n1>0.

8. The transmitting device of claim 7, wherein the n−n1 parity check bits are mapped to n−n1 most reliable bit positions among bit positions with an equal minimum row weight, based on there being greater than n−n1 bit positions with the equal minimum row weight.

9. The transmitting device of claim 7, wherein the K+n bit positions among a total of N bit positions of the Polar code are determined based on a predefined Polar sequence, N is a positive integer greater than K+n.

10. The transmitting device of claim 9, wherein the predefined Polar sequence includes a sequence ordering bit indices 0 to N−1 corresponding one by one to bit positions 0 to N−1 of the Polar code in ascending order of reliability.

11. A receiving device for receiving information in a wireless communication system, the receiving device comprising, a transceiver;

a processor; and a memory storing at least one program that causes the processor to perform operations comprising:

receiving encoded information; and decoding the encoded information based on a Polar code, wherein decoding the encoded information based on the Polar code comprises:

decoding the encoded information based on a mapping relationship between input information of K+n bits and bit positions of the Polar code, where K and n are positive integers, wherein the input information includes n parity check bits, and wherein the mapping relationship comprises:

mapping n1 parity check bits among the n parity check bits to n1 least reliable bit positions among K+n bit positions of the Polar code, and mapping n−n1 parity check bits among the n parity check bits to n−n1 bit positions with a minimum row weight among K+n−n1 bit positions except for the n1 least reliable bit positions among the K+n bit positions, where n1 is a positive integer, and n−n1>0.

12. The receiving device of claim 11, wherein in the mapping relationship: the n−n1 parity check bits are mapped to n−n1 most reliable bit positions among bit positions with an equal minimum row weight, based on there being greater when there is more than n−n1 bit positions with the equal minimum row weight.

* * * * *